(12) United States Patent
Zawodny et al.

(10) Patent No.: US 10,878,856 B2
(45) Date of Patent: Dec. 29, 2020

(54) DATA TRANSFER BETWEEN SUBARRAYS IN MEMORY

(71) Applicant: Micron Technology, Inc., Boise, ID (US)

(72) Inventors: Jason T. Zawodny, Grand Rapids, MI (US); Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/716,052

(22) Filed: Dec. 16, 2019

(65) Prior Publication Data

US 2020/0118603 A1    Apr. 16, 2020

Related U.S. Application Data

(63) Continuation of application No. 16/138,287, filed on Sep. 21, 2018, now Pat. No. 10,510,381, which is a
(Continued)

(51) Int. Cl.
*G11C 7/06*    (2006.01)
*G06F 3/06*    (2006.01)
(Continued)

(52) U.S. Cl.
CPC .............. *G11C 7/06* (2013.01); *G06F 3/0647* (2013.01); *G11C 5/025* (2013.01); *G11C 7/1006* (2013.01); *G11C 11/4091* (2013.01)

(58) Field of Classification Search
CPC ..... G11C 7/08; G11C 11/4091; G06F 3/0647; G06F 3/061; G06F 3/0673
See application file for complete search history.

(56) References Cited

U.S. PATENT DOCUMENTS 4,380,046 A    4/1983    Fung
4,435,792 A    3/1984    Bechtolsheim
(Continued)

FOREIGN PATENT DOCUMENTS

CN    101681672    3/2010
CN    102141905    8/2011
(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.
(Continued)

*Primary Examiner* — Ajay Ojha
(74) *Attorney, Agent, or Firm* — Brooks, Cameron & Huebsch, PLLC

(57) ABSTRACT

The present disclosure includes apparatuses and methods for data transfer between subarrays in memory. An example may include a first subarray of memory cells and a second subarray of memory cells, wherein a first portion of memory cells of the first subarray and a first portion of memory cells of the second subarray are coupled to a first sensing circuitry stripe. A third subarray of memory cells can include a first portion of memory cells coupled to a second sensing circuitry stripe. A second portion of memory cells of the second subarray and a second portion of memory cells of the third subarray can be coupled to a third sensing circuitry stripe. A particular row of the second array can include memory cells from the first portion of memory cells in the second array coupled to memory cells from the second portion of memory cells in the second array.

17 Claims, 8 Drawing Sheets

Related U.S. Application Data continuation of application No. 15/616,642, filed on Jun. 7, 2017, now Pat. No. 10,262,701.

(51) Int. Cl.

| | | |
|---|---|---|
| *G11C 11/4091* | (2006.01) | |
| *G11C 5/02* | (2006.01) | |
| *G11C 7/10* | (2006.01) | |

(56) References Cited

U.S. PATENT DOCUMENTS

| | | | |
|---|---|---|---|
| 4,435,793 | A | 3/1984 | Ochii |
| 4,727,474 | A | 2/1988 | Batcher |
| 4,843,264 | A | 6/1989 | Galbraith |
| 4,958,378 | A | 9/1990 | Bell |
| 4,977,542 | A | 12/1990 | Matsuda et al. |
| 5,023,838 | A | 6/1991 | Herbert |
| 5,034,636 | A | 7/1991 | Reis et al. |
| 5,201,039 | A | 4/1993 | Sakamura |
| 5,210,850 | A | 5/1993 | Kelly et al. |
| 5,253,308 | A | 10/1993 | Johnson |
| 5,276,643 | A | 1/1994 | Hoffmann et al. |
| 5,325,519 | A | 6/1994 | Long et al. |
| 5,367,488 | A | 11/1994 | An |
| 5,379,257 | A | 1/1995 | Matsumura et al. |
| 5,386,379 | A | 1/1995 | Ali-Yahia et al. |
| 5,398,213 | A | 3/1995 | Yeon et al. |
| 5,440,482 | A | 8/1995 | Davis |
| 5,446,690 | A | 8/1995 | Tanaka et al. |
| 5,473,576 | A | 12/1995 | Matsui |
| 5,481,500 | A | 1/1996 | Reohr et al. |
| 5,485,373 | A | 1/1996 | Davis et al. |
| 5,506,811 | A | 4/1996 | McLaury |
| 5,615,404 | A | 3/1997 | Knoll et al. |
| 5,638,128 | A | 6/1997 | Hoogenboom |
| 5,638,317 | A | 6/1997 | Tran |
| 5,654,936 | A | 8/1997 | Cho |
| 5,678,021 | A | 10/1997 | Pawate et al. |
| 5,724,291 | A | 3/1998 | Matano |
| 5,724,366 | A | 3/1998 | Furutani |
| 5,751,987 | A | 5/1998 | Mahant-Shetti et al. |
| 5,787,458 | A | 7/1998 | Miwa |
| 5,854,636 | A | 12/1998 | Watanabe et al. |
| 5,867,429 | A | 2/1999 | Chen et al. |
| 5,870,504 | A | 2/1999 | Nemoto et al. |
| 5,915,084 | A | 6/1999 | Wendell |
| 5,935,263 | A | 8/1999 | Keeth et al. |
| 5,986,942 | A | 11/1999 | Sugibayashi |
| 5,991,209 | A | 11/1999 | Chow |
| 5,991,785 | A | 11/1999 | Alidina et al. |
| 6,005,799 | A | 12/1999 | Rao |
| 6,009,020 | A | 12/1999 | Nagata |
| 6,092,186 | A | 7/2000 | Betker et al. |
| 6,122,211 | A | 9/2000 | Morgan et al. |
| 6,125,071 | A | 9/2000 | Kohno et al. |
| 6,134,164 | A | 10/2000 | Lattimore et al. |
| 6,147,514 | A | 11/2000 | Shiratake |
| 6,151,244 | A | 11/2000 | Fujino et al. |
| 6,157,578 | A | 12/2000 | Brady |
| 6,163,862 | A | 12/2000 | Adams et al. |
| 6,166,942 | A | 12/2000 | Vo et al. |
| 6,172,918 | B1 | 1/2001 | Hidaka |
| 6,175,514 | B1 | 1/2001 | Henderson |
| 6,181,698 | B1 | 1/2001 | Hariguchi |
| 6,208,544 | B1 | 3/2001 | Beadle et al. |
| 6,226,215 | B1 | 5/2001 | Yoon |
| 6,301,153 | B1 | 10/2001 | Takeuchi et al. |
| 6,301,164 | B1 | 10/2001 | Manning et al. |
| 6,304,477 | B1 | 10/2001 | Naji |
| 6,389,507 | B1 | 5/2002 | Sherman |
| 6,418,498 | B1 | 7/2002 | Martwick |
| 6,466,499 | B1 | 10/2002 | Blodgett |
| 6,510,098 | B1 | 1/2003 | Taylor |
| 6,563,754 | B1 | 5/2003 | Lien et al. |
| 6,578,058 | B1 | 6/2003 | Nygaard |
| 6,731,542 | B1 | 5/2004 | Le et al. |
| 6,754,746 | B1 | 6/2004 | Leung et al. |
| 6,768,679 | B1 | 7/2004 | Le et al. |
| 6,807,614 | B2 | 10/2004 | Chung |
| 6,816,422 | B2 | 11/2004 | Hamade et al. |
| 6,819,612 | B1 | 11/2004 | Achter |
| 6,894,549 | B2 | 5/2005 | Eliason |
| 6,943,579 | B1 | 9/2005 | Hazanchuk et al. |
| 6,948,056 | B1 | 9/2005 | Roth et al. |
| 6,950,771 | B1 | 9/2005 | Fan et al. |
| 6,950,898 | B2 | 9/2005 | Merritt et al. |
| 6,956,770 | B2 | 10/2005 | Khalid et al. |
| 6,961,272 | B2 | 11/2005 | Schreck |
| 6,965,648 | B1 | 11/2005 | Smith et al. |
| 6,985,394 | B2 | 1/2006 | Kim |
| 6,987,693 | B2 | 1/2006 | Cernea et al. |
| 7,020,017 | B2 | 3/2006 | Chen et al. |
| 7,028,170 | B2 | 4/2006 | Saulsbury |
| 7,045,834 | B2 | 5/2006 | Tran et al. |
| 7,054,178 | B1 | 5/2006 | Shiah et al. |
| 7,061,817 | B2 | 6/2006 | Raad et al. |
| 7,079,407 | B1 | 7/2006 | Dimitrelis |
| 7,173,857 | B2 | 2/2007 | Kato et al. |
| 7,187,585 | B2 | 3/2007 | Li et al. |
| 7,196,928 | B2 | 3/2007 | Chen |
| 7,260,565 | B2 | 8/2007 | Lee et al. |
| 7,260,672 | B2 | 8/2007 | Garney |
| 7,372,715 | B2 | 5/2008 | Han |
| 7,400,532 | B2 | 7/2008 | Aritome |
| 7,406,494 | B2 | 7/2008 | Magee |
| 7,447,720 | B2 | 11/2008 | Beaumont |
| 7,454,451 | B2 | 11/2008 | Beaumont |
| 7,457,181 | B2 | 11/2008 | Lee et al. |
| 7,515,501 | B2 | 4/2009 | Bessho et al. |
| 7,535,769 | B2 | 5/2009 | Cernea |
| 7,546,438 | B2 | 6/2009 | Chung |
| 7,562,198 | B2 | 7/2009 | Noda et al. |
| 7,574,466 | B2 | 8/2009 | Beaumont |
| 7,602,647 | B2 | 10/2009 | Li et al. |
| 7,663,928 | B2 | 2/2010 | Tsai et al. |
| 7,685,365 | B2 | 3/2010 | Rajwar et al. |
| 7,692,466 | B2 | 4/2010 | Ahmadi |
| 7,752,417 | B2 | 7/2010 | Manczak et al. |
| 7,791,962 | B2 | 9/2010 | Noda et al. |
| 7,796,453 | B2 | 9/2010 | Riho et al. |
| 7,805,587 | B1 | 9/2010 | Van Dyke et al. |
| 7,808,854 | B2 | 10/2010 | Takase |
| 7,827,372 | B2 | 11/2010 | Bink et al. |
| 7,869,273 | B2 | 1/2011 | Lee et al. |
| 7,898,864 | B2 | 3/2011 | Dong |
| 7,924,628 | B2 | 4/2011 | Danon et al. |
| 7,937,535 | B2 | 5/2011 | Ozer et al. |
| 7,957,206 | B2 | 6/2011 | Bauser |
| 7,979,667 | B2 | 7/2011 | Allen et al. |
| 7,996,749 | B2 | 8/2011 | Ding et al. |
| 8,042,082 | B2 | 10/2011 | Solomon |
| 8,045,391 | B2 | 10/2011 | Mohklesi |
| 8,059,438 | B2 | 11/2011 | Chang et al. |
| 8,095,825 | B2 | 1/2012 | Hirotsu et al. |
| 8,117,462 | B2 | 2/2012 | Snapp et al. |
| 8,164,942 | B2 | 4/2012 | Gebara et al. |
| 8,208,328 | B2 | 6/2012 | Hong |
| 8,213,248 | B2 | 7/2012 | Moon et al. |
| 8,223,568 | B2 | 7/2012 | Seo |
| 8,238,173 | B2 | 8/2012 | Akerib et al. |
| 8,274,841 | B2 | 9/2012 | Shimano et al. |
| 8,279,683 | B2 | 10/2012 | Klein |
| 8,310,884 | B2 | 11/2012 | Iwai et al. |
| 8,332,367 | B2 | 12/2012 | Bhattacherjee et al. |
| 8,339,824 | B2 | 12/2012 | Cooke |
| 8,339,883 | B2 | 12/2012 | Yu et al. |
| 8,347,154 | B2 | 1/2013 | Bahali et al. |
| 8,351,292 | B2 | 1/2013 | Matano |
| 8,356,144 | B2 | 1/2013 | Hessel et al. |
| 8,417,921 | B2 | 4/2013 | Gonion et al. |
| 8,462,532 | B1 | 6/2013 | Argyres |
| 8,484,276 | B2 | 7/2013 | Carlson et al. |
| 8,495,438 | B2 | 7/2013 | Roine |
| 8,503,250 | B2 | 8/2013 | Demone |

(56) References Cited

U.S. PATENT DOCUMENTS

| | | |
|---|---|---|
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,659,605 B1 | 5/2017 | Zawodny et al. |
| 9,659,610 B1 | 5/2017 | Hush |
| 9,911,727 B2 | 3/2018 | Liaw |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0247673 A1 | 9/2014 | Muralimanohar et al. |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0234707 A1 | 8/2015 | Vogelsang et al. |
| 2015/0270015 A1 | 9/2015 | Murphy et al. |
| 2015/0279466 A1 | 10/2015 | Manning |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |
| 2016/0225422 A1 | 8/2016 | Tiwari et al. |

(56) References Cited

U.S. PATENT DOCUMENTS

| | | | |
|---|---|---|---|
| 2016/0266873 | A1 | 9/2016 | Tiwari et al. |
| 2016/0266899 | A1 | 9/2016 | Tiwari |
| 2016/0267951 | A1 | 9/2016 | Tiwari |
| 2016/0292080 | A1 | 10/2016 | Leidel et al. |
| 2016/0306584 | A1 | 10/2016 | Zawodny et al. |
| 2016/0306614 | A1 | 10/2016 | Leidel et al. |
| 2016/0316107 | A1 | 10/2016 | Shacham et al. |
| 2016/0350230 | A1 | 12/2016 | Murphy |
| 2016/0365129 | A1 | 12/2016 | Willcock |
| 2016/0371033 | A1 | 12/2016 | La Fratta et al. |
| 2017/0052906 | A1 | 2/2017 | Lea |

FOREIGN PATENT DOCUMENTS

| | | |
|---|---|---|
| CN | 104240750 | 12/2014 |
| CN | 105990333 | 10/2016 |
| EP | 0214718 | 3/1987 |
| EP | 2026209 | 2/2009 |
| JP | H0831168 | 2/1996 |
| JP | 2009259193 | 3/2015 |
| KR | 10-0211482 | 8/1999 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.
Boyd et al., "On the General Applicability of Instruction-Set Randomization", Jul.-Sep. 2010, (14 pgs.), vol. 7, Issue 3, IEEE Transactions on Dependable and Secure Computing.
Elliot, et al., "Computational RAM: Implementing Processors in Memory", Jan.-Mar. 1999, (10 pgs.), vol. 16, Issue 1, IEEE Design and Test of Computers Magazine.
Office Action for related China Patent Application No. 201810573822.7, dated Aug. 19, 2019, 15 pages.
Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.
Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.
Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.
Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.
U.S. Appl. No. 13/449,082, entitled, "Methods and Apparatus for Pattern Matching," filed Apr. 17, 2012, (37 pgs.).
U.S. Appl. No. 13/743,686, entitled, "Weighted Search and Compare in a Memory Device," filed Jan. 17, 2013, (25 pgs.).
U.S. Appl. No. 13/774,636, entitled, "Memory as a Programmable Logic Device," filed Feb. 22, 2013, (30 pgs.).
U.S. Appl. No. 13/774,553, entitled, "Neural Network in a Memory Device," filed Feb. 22, 2013, (63 pgs.).
U.S. Appl. No. 13/796,189, entitled, "Performing Complex Arithmetic Functions in a Memory Device," filed Mar. 12, 2013, (23 pgs.).
International Search Report and Written Opinion for PCT Application No. PCT/US2013/043702, dated Sep. 26, 2013, (11 pgs.).
Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.
Pagiamtzis, Kostas, "Content-Addressable Memory Introduction", Jun. 25, 2007, (6 pgs.), retrieved from: http://www.pagiamtzis.com/cam/camintro.
Debnath, Biplob, Bloomflash: Bloom Filter on Flash-Based Storage, 2011 31st Annual Conference on Distributed Computing Systems, Jun. 20-24, 2011, 10 pgs.
Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

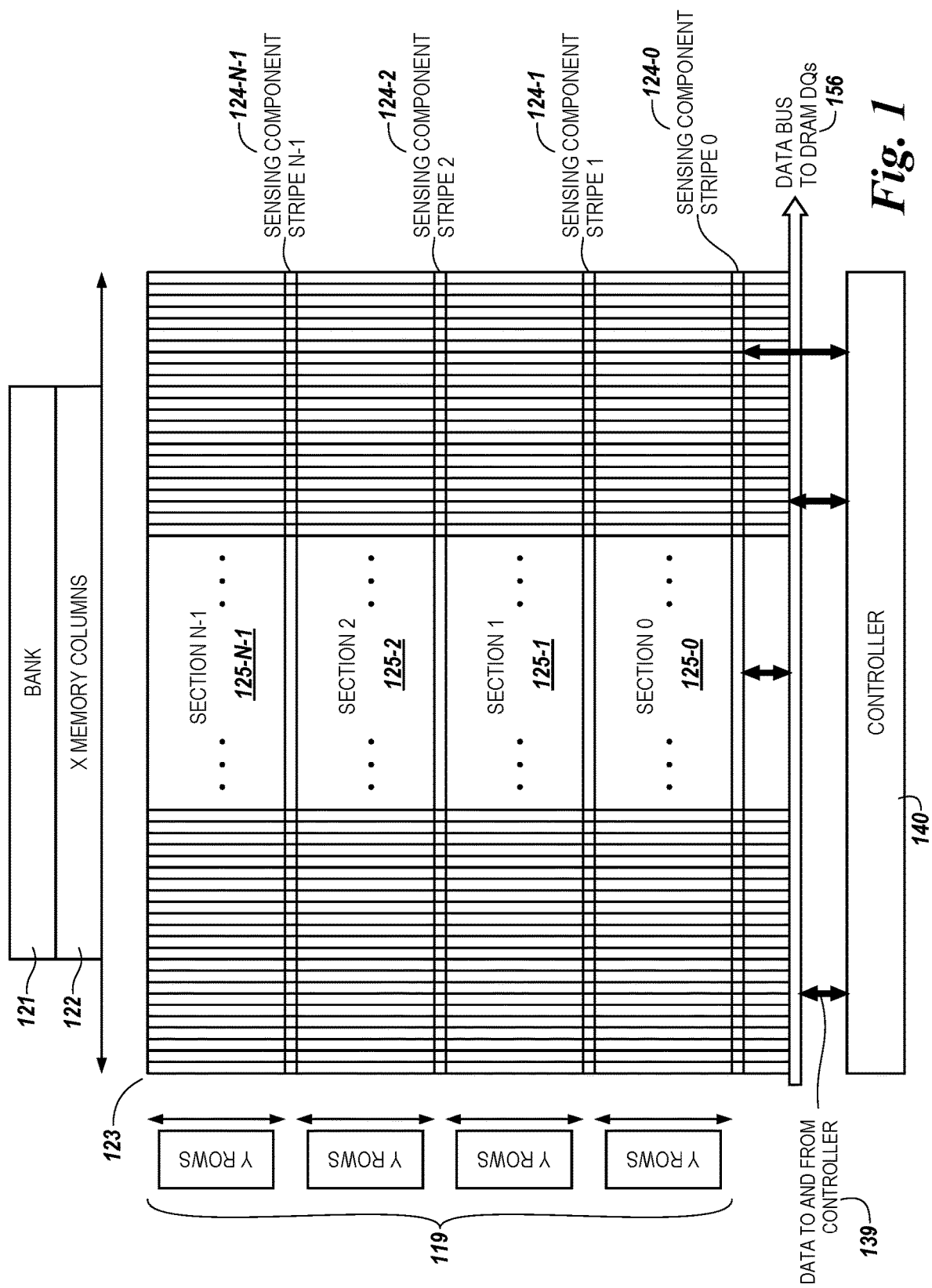

DATA TRANSFER BETWEEN SUBARRAYS IN MEMORY

PRIORITY INFORMATION

This application is a Continuation of U.S. application Ser. No. 16/138,287, filed Sep. 21, 2018, which issues as U.S. Pat. No. 10,510,381 on Dec. 17, 2019, which is a Continuation of U.S. application Ser. No. 15/616,642, filed Jun. 7, 2017, which issued as U.S. Pat. No. 10,262,701 on Apr. 16, 2019, the contents of which are included herein by reference.

TECHNICAL FIELD

The present disclosure relates generally to semiconductor memory and methods, and more particularly, to apparatuses and methods for data transfer between subarrays in memory.

BACKGROUND

Memory devices are typically provided as internal, semiconductor, integrated circuits in computers or other electronic systems. There are many different types of memory including volatile and non-volatile memory. Volatile memory can require power to maintain its data, e.g., host data, error data, etc., and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources, e.g., one or more processors, which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data, e.g., one or more operands. As used herein, an operation can be, for example, a Boolean operation, such as AND, OR, NOT, NOT, NAND, NOR, and XOR, and/or other operations, e.g., invert, shift, arithmetic, statistics, among many other possible operations. For example, functional unit circuitry may be used to perform the arithmetic operations, such as addition, subtraction, multiplication, and division on operands, via a number of logical operations.

A number of components in an electronic system may be involved in providing instructions to the functional unit circuitry for execution. The instructions may be executed, for instance, by a processing resource such as a controller and host processor. Data, e.g., the operands on which the instructions will be executed, may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources, e.g., processor and associated functional unit circuitry, may be external to the memory array, and data is accessed via a bus between the processing resources and the memory array to execute a set of instructions. Processing performance may be improved in a processing in memory device, in which a processor may be implemented internally and near to a memory, e.g., directly on a same chip as the memory array. A processing in memory device may save time by reducing and eliminating external communications and may also conserve power. However, the potential for other functions, such as read and write operations, being performed in addition to processing operations may influence the data processing time of the processing in memory device.

BRIEF DESCRIPTION OF THE DRAWINGS

FIG. 1 is a block diagram of a plurality of sections of a bank of a memory device in a computing system in accordance with a number of embodiments of the present disclosure.

DETAILED DESCRIPTION

Figure 2A:
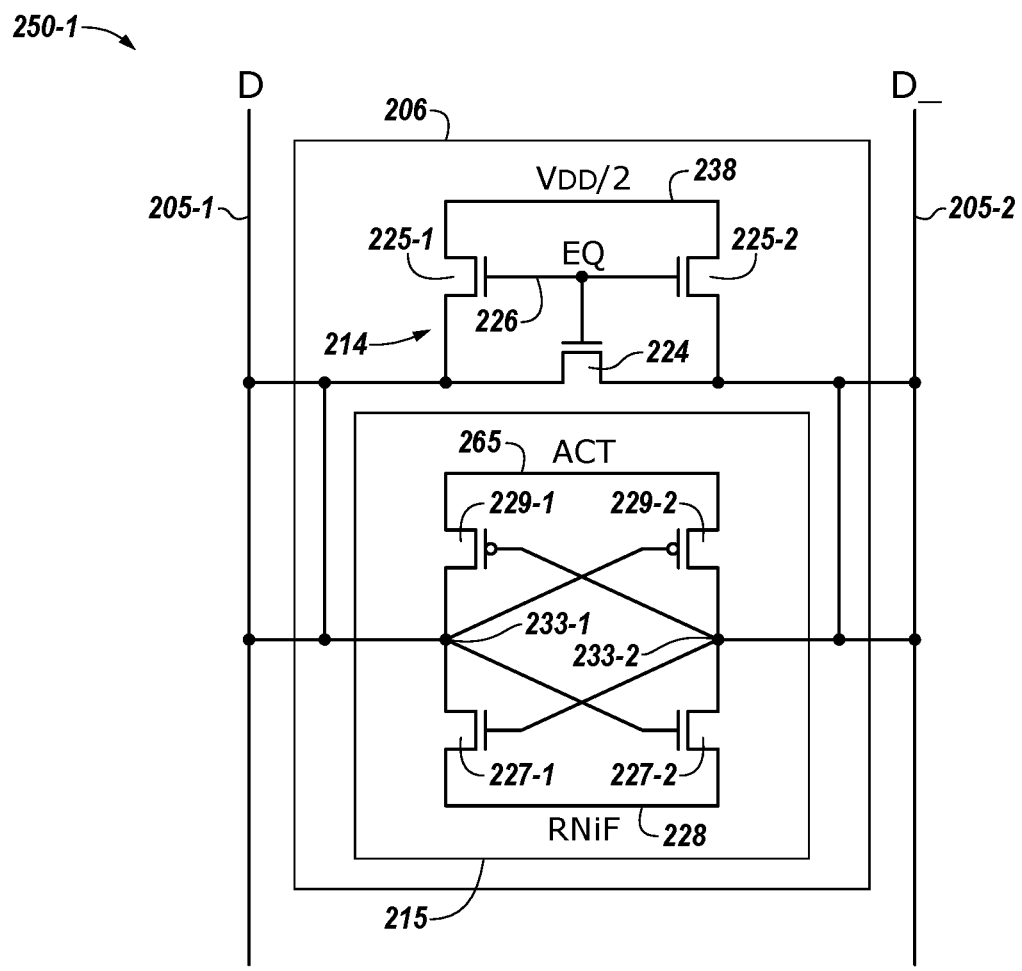
FIGS. 2A-2B are schematic diagrams illustrating sensing circuitry in accordance with a number of embodiments of the present disclosure.

The present disclosure includes apparatuses and methods for data transfer between subarrays in memory. As described herein, an example apparatus may include a first subarray of memory cells and a second subarray of memory cell, wherein a first portion of memory cells of the first subarray and a first portion of memory cells of the second subarray are coupled to a first sensing circuitry stripe. The example apparatus may also include a third subarray of memory cells, wherein a first portion of memory cells of the third subarray are coupled to a second sensing circuitry stripe and wherein a second portion of memory cells of the second subarray and a second portion of memory cells of the third subarray are coupled to a third sensing circuitry stripe. A particular row of the second array can include memory cells from the first portion of memory cells in the second array coupled to memory cells from the second portion of memory cells in the second array by coupling the memory cells from the first portion of memory cells to adjacent memory cells from the second portion of memory cells.

As described herein, a memory device may be utilized that has a one transistor, one capacitor (1T1C) memory cell configuration, e.g., in a DRAM array, among other types of memory. As such, an example apparatus described herein includes a plurality of subarrays where every other column of memory cells in each subarray is coupled to sensing circuitry stripes positioned adjacent an edge of the subarray and the remaining columns of memory cells in each subarray are coupled to sensing circuitry stripes positioned adjacent to another edge of the subarray.

In a number of embodiments, data can be transferred between subarrays in a memory array by moving data from a first portion of memory cells in a row of a first subarray to a first sensing circuitry stripe shared by a first portion of memory cells in a second subarray adjacent to the first subarray. The data from the row of the first subarray can be stored on a number of first nodes in the first sensing circuitry stripe coupled to the first subarray. The complement of the data can be stored on a number of second nodes in the first sensing circuitry stripe coupled to the second subarray.

The complement of the data can be moved from the first sensing circuitry stripe to the first portion of memory cells and a second portion of memory cells of a particular row in the second subarray. The complement of the data is moved from the first sensing circuitry stripe to the first portion of the memory cells of the particular row in the second subarray and then shifted to the second portion of the memory cells of the particular row in the second subarray. Adjacent cells of the first portion and the second portion of memory cells of the particular row in the second subarray that are coupled to different sensing circuitry stripes are coupled together, therefore opening the particular row will cause the complement of the data to be stored on the first portion of memory cells coupled to the first sensing circuitry stripe and then shifted to the second portion of memory cells coupled to a second sensing circuitry stripe.

The complement of the data can be stored on a number of first nodes in the second sensing circuitry stripe coupled to the second subarray and the data can be stored on a number of second nodes in the second sensing circuitry stripe coupled to a third subarray by activating the second sensing circuitry stripe. The complement of the data can be stored on a second portion of memory cells on a row in the second subarray by turning on the row in the second subarray. Also, the data can be moved to a third subarray that is adjacent to the second subarray.

The data can be moved from the second sensing circuitry stripe to a first portion of memory cells and a second portion of memory cells of a particular row in the third subarray by activating the particular row in the third subarray. The data can be moved from the second sensing circuitry stripe to the first portion of the memory cells of the particular row in the third subarray and then shifted to the second portion of the memory cells of the particular row in the third subarray. Adjacent cells of the first portion and the second portion of memory cells of the particular row in the third subarray that are coupled to different sensing circuitry stripes are coupled together, therefore opening the particular row will cause the data to be stored on the first portion of memory cells coupled to the second sensing circuitry stripe and then shifted to the second portion of memory cells coupled to a third sensing circuitry stripe.

The data can be stored on a number of first nodes in the third sensing circuitry stripe coupled to the third subarray and the complement of the data can be stored on a number of second nodes in the third sensing circuitry stripe coupled to a fourth subarray by activating the third sensing circuitry stripe. The data can be stored on a first portion of memory cells on a row in the third subarray coupled to the third sensing circuitry stripe by turning on the row in the third subarray. Also, the data can be moved to a fourth subarray that is adjacent to the third subarray.

In a number of embodiments, the process of moving data and/or the complement of the data to an adjacent subarray via shared sensing circuitry stripes, shifting the data and/or the complement of the data to an adjacent portions of memory cells in the adjacent subarray coupled to a different sensing circuitry stripe, and moving the data and/or the complement of the data to the different sensing stripe can be used any number of times to transfer data and/or the complement of the data to various subarrays in an array of memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure. Ordinal numbers such as "first", "second", "third", etc., as used herein, are intended to differentiate types or uses of sensing circuitry, sense amplifiers, sense lines, memory cells, etc., and not an order in which they are positioned, unless explicitly stated otherwise.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more", e.g., a number of sections of memory arrays, can refer to one or more of such sections, whereas a "plurality of" is intended to refer to more than one of such things. Furthermore, the words "can" and "may" are used throughout this application in a permissive sense, i.e., having the potential to, being able to, not in a mandatory sense, i.e., must. The term "include," and derivations thereof, means "including, but not limited to". The terms "coupled" and "coupling" mean to be directly or indirectly connected physically or for access to and movement (transmission) of commands and/or data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 140 may reference element "40" in FIG. 1, and a similar element may be referenced as 840 in FIG. 8. As will be appreciated, elements shown in the various embodiments herein can be added, exchanged, and/or eliminated so as to provide a number of additional embodiments of the present disclosure. In addition, the proportion and/or the relative scale of the elements provided in the figures are intended to illustrate certain embodiments of the present disclosure and should not be taken in a limiting sense.

FIG. 1 is a block diagram of a plurality of sections, e.g., sections 125-0, 125-1, . . . , 125-N-1, of a bank 121 of a memory device, e.g., as shown at 820 in FIG. 8, in a computing system in accordance with a number of embodiments of the present disclosure. By way of illustration, FIG. 1 shows a bank section 123 of the bank 121 of the memory device. For example, bank section 123 can represent an example bank section of a number of bank sections of the bank 121 of the memory device, e.g., bank section 0, bank section 1, . . . , bank section M-1 (not shown). As shown in FIG. 1, a bank section 123 can include a plurality of memory columns 122 shown horizontally as X, e.g., 4096, 8192, or 16,384 columns, among various possibilities, in an example DRAM bank and/or bank section. Additionally, the bank section 123 may be divided into section 0, section 1, . . . , and section N-1, e.g., 32, 64, or 128 sections, among various possibilities, shown at 125-0, 125-1, . . . , 125-N-1, respectively, that are separated by amplification regions configured to be coupled to a data path. As such, the sections 125-0, 125-1, . . . , 125-N-1 can each have amplification regions 124-0, 124-1, . . . , 124-N-1 that correspond to sensing component stripe 0, sensing component stripe 1, . . . , and sensing component stripe N-1, respectively.

Each column 122, e.g., single or each pair of sense or digit lines, is configured to be coupled to sensing circuitry, as described in connection with sensing circuitry 850 in FIG. 8 and in more detail in connection with FIGS. 2A-2B and FIG. 3. As such, each column 122 in a section 125 can be coupled individually to a sense amplifier that contributes to a sensing component stripe 124 for that section. For example, as shown in FIG. 1, the bank section 123 can include sensing component stripe 0, sensing component stripe 1, . . . , sensing component stripe N-1 that each have sensing circuitry with sense amplifiers that can, in various embodiments, be used as registers, cache and/or data buffering and that are coupled to each column 122 in the sections 125-0, 125-1, . . . , 125-N-1.

Each of the of the sections 125-0, 125-1, . . . , 125-N-1 can include a plurality of rows 119 shown vertically as Y, e.g., each section may include 256, 512, 1024 rows, among various possibilities, in an example DRAM bank. Embodiments are not limited to the example horizontal and vertical orientation of columns and rows described herein or the example numbers thereof. Each of the plurality of rows 119 can include a single memory cell selectably coupled to each sense line, e.g., as shown and described in connection with a 1T1C configuration in FIGS. 4A-4B, and/or pairs of complementary memory cells, e.g., as shown in and described in connection with a 2T2C configuration in FIG. 3. Each of the complementary memory cells of the pair can be coupled to one of a respective pair of sense lines at a position of the sense lines on the row. As such, the number of memory cells in a row can correspond to the number of sense lines that intersect that row.

For example, in a section with all memory cells in a 1T1C configuration, e.g., as shown and described in connection with sections 425-0, 425-1, and 425-2 in FIG. 4A, the number of 1T1C memory cells 418 in a row, e.g., rows 419, may correspond to the number of sense lines 405 and columns 122, which also may correspond to the number of 1T1C sense amplifiers 417. In contrast, in a section with some memory cells in a 2T2C configuration, the number of 2T2C memory cells in a row also may correspond to the number of sense lines, the number of columns 122, and/or the number of 2T2C sense amplifiers, as described herein.

As shown in FIG. 1, portions of the sensing circuitry, e.g., sense amplifiers, compute components, etc., can be separated between a number of sensing component stripes 124 that are each physically associated with a section of memory cells 125 in the bank section 123. The sense amplifiers may sense data values stored by memory cells of the sections and/or the sense amplifiers may sense residual voltages on the sense lines as a reference voltage for determination of a sensed data value.

For example, as shown and described in connection with FIG. 4A, a 1T1C sense amplifier, e.g., 417-1-0, in a sensing component stripe, e.g., 424-1, may sense a data value stored by a 1T1C memory cell in a row, e.g., 419-0, via a portion of a sense line, e.g., 405-1-0, extending into array section 425-0 and coupled to the 1T1C memory cell, e.g., 418-0. The same 1T1C sense amplifier uses a complementary portion of the sense line, e.g., 405-1-0, extending into the adjacent array section 425-1, and which is not coupled to any 1T1C memory cell, to sense a reference voltage in the complementary portion of the sense line. The reference voltage in the complementary portion of the sense line, e.g., 405-1-0, enables determination of a relative voltage level on the portion of the sense line coupled to the 1T1C memory cell. Alternatively, the data value may be sensed by the 1T1C sense amplifier, e.g., 417-0, in a memory cell, e.g., in row 419-1, of the adjacent array section while using the reference voltage sensed in the complementary portion of the sense line extending into the array section.

In some embodiments, the sense amplifiers may at least temporarily store, e.g., cache, sensed data values. The compute components described herein in connection with the sense amplifiers may, in some embodiments, perform compute operations on the cached data values in the plurality of sensing component stripes 124.

As shown in FIG. 1, the bank section 123 can be associated with controller 140. The controller 140 shown in FIG. 1 can, in various embodiments, represent at least a portion of the functionality embodied by and contained in the controller 840 shown in and described in connection with FIG. 8. The controller 140 can direct, e.g., control, input of commands and data 139 to the bank section 123 and/or output, e.g., movement, of data from the bank section 123.

The bank section 123 can include a data bus, e.g., a 64 bit wide data bus, to DRAM DQs, which can correspond to the data bus 156, and/or 656 shown and described in connection with FIGS. 1 and/or 6, respectively. Each data bus for each bank of sections, e.g., 125-0, 125-1, . . . , 125-N-1, can be referred to as a portion of a data bus that contributes to formation of a combined data bus, e.g., for a plurality of banks and/or memory devices. As such, in some embodiments, eight 64 bit wide data bus portions for eight banks can contribute to a 512 bit wide combined data bus. Alternatively or in addition, each bank can individually use the entirety of the 512 bit wide combined data bus, although one bank at a time. Various combinations of using the data bus portions also may be utilized. For example, one bank may use four data bus portions at the same time as four other banks each use one of the remaining four data bus portions, among other possibilities.

In order to appreciate the performance of operations described herein, a discussion of an apparatus for implementing such techniques follows. For example, such an apparatus may be a memory device having a controller, e.g., as shown at 140 and/or 640 and described in connection with FIGS. 1 and/or 6, that is on chip with a memory array and/or sensing circuitry thereof, e.g., as shown at 630 and 650, respectively, and described in connection with FIG. 8 and/or having a capability for bit vector operations, e.g., PIM capabilities, and an associated host. However, embodiments described herein are not limited to memory devices having PIM capabilities.

As such, in some embodiments, program instructions, e.g., PIM commands, involving a memory device having PIM capabilities can distribute implementation of the PIM commands and data over multiple sensing circuitries that can implement operations and can move and store the PIM commands and data within the memory array, e.g., without having to transfer such back and forth over an A/C and data bus between a host and the memory device. Thus, data for a memory device having PIM capabilities can be accessed and used in less time and/or using less power. For example, a time and power advantage can be realized by increasing the speed, rate, and/or efficiency of data being moved around and stored in a computing system in order to process requested memory array operations. Such operations may include compute operations, such as reads and/or writes, etc., as DRAM operations and/or PIM logical operations, such as logical Boolean operations, data movement operations, etc., among others described herein.

FIG. 2A is a schematic diagram illustrating sensing circuitry 250-1 in accordance with a number of embodiments of the present disclosure. FIG. 2A shows a sense amplifier 206 coupled to a respective pair of complementary sense lines 205-1 and 205-2. The sense amplifier 206 shown in FIG. 2A can correspond to a plurality of sense amplifiers in the sensing circuitry associated with the plurality of sensing component stripes 124 shown in FIG. 1, for example, and/or in the sensing circuitry 650 shown in FIG. 6.

As shown and described in connection with FIG. 3, complementary memory cells are coupled to pairs of complementary sense lines 205-1 and 205-2, e.g., as columns, shown in FIG. 2A. For example, a memory cell can comprise a transistor and a capacitor. The memory cells can be, for example, 1T1C DRAM cells each comprising a storage element, e.g., a capacitor, and an access device, e.g., a transistor, although other configurations can be used, e.g., 2T2C with two transistors and two capacitors per memory cell. In a number of embodiments, the memory cells may be destructive read memory cells, e.g., reading the data stored in the cell destroys the data such that the data originally stored in the cell may be refreshed after being read. The cells of the memory array can be arranged in rows coupled by access lines and columns coupled by a single sense line extending into each of the adjacent sections in a 1T1C configuration, as show in and described in connection with FIGS. 4A-4B or coupled by pairs of complementary sense lines in a 2T2C configuration, for example, DIGIT(n−1)/DIGIT(n−1)_, DIGIT(n)/DIGIT(n)_, DIGIT(n+1)/DIGIT(n+1)_, as shown at 205-1 and 205-2 in FIG. 2A and elsewhere herein. The individual sense lines corresponding to each pair of complementary data lines can also be referred to as sense lines 205-1 (D) and 205-2 (D_) respectively. Although only three pairs of complementary sense lines, e.g., three columns, are shown in FIG. 3, embodiments of the present disclosure are not so limited. For example, an array of memory cells can include additional columns of memory cells and/or sense lines, e.g., 4,096, 8,192, 16,384, etc.

Memory cells can be coupled to different sense lines and/or access lines. For example, a first source/drain region of an access transistor of a memory cell can be coupled to a sense line 205-1 (D), a second source/drain region of the access transistor of the memory cell can be coupled to a capacitor of the memory cell, and a gate of the access transistor of the memory cell can be coupled to an access line of the memory array.

As shown in FIG. 2A, the sensing circuitry 250-1 can comprise a sense amplifier 206 corresponding to a respective column of memory cells, e.g., coupled to respective pairs of complementary sense lines. The sense amplifier 206 can comprise, for example, a cross coupled latch, which can be referred to herein as a primary latch. A data storage state can include the sense amplifiers 206 storing a data value. As used herein, a data value can be referred to as a bit, e.g., an abbreviation of "binary digit".

In a number of examples, the sense amplifier 206 (or a compute component 231 as shown in and described in connection with FIG. 2B) can be in at least one of two states associated with the first mode and the second mode. As used herein, a state of a sense amplifier 206 can describe a transfer of data to or from the sense amplifier 206. The state of the sense amplifier 206 can also be described as whether the sense amplifier 206 is in an equilibration state or is storing a data value, e.g., a binary 0 or 1 data value. For example, a sense amplifier can be configured to be in an initial state, wherein the initial state is one of an equilibration state and a data storage state.

According to various embodiments, a sense amplifier 206 can comprise a cross coupled latch. However, embodiments of the sense amplifier 206 are not limited to a cross coupled latch. For example, the sense amplifier 206 in FIG. 2A can be current-mode sense amplifier and/or single-ended sense amplifier, e.g., sense amplifier coupled to one data line. Embodiments of the present disclosure also are not limited to a folded data line architecture.

In a number of embodiments, a sense amplifier 206 can comprise a number of transistors formed on pitch with the transistors of a corresponding compute component, e.g., compute component 231 shown and described in connection with FIG. 2B, and/or the memory cells of an array, e.g., memory array 830 shown in FIG. 8 and/or memory cells 302/303 shown in FIG. 3, to which they are coupled, which may conform to a particular feature size, e.g., $4F^2$, $6F^2$, etc. Sense amplifier 206 comprises a latch 215 including four transistors coupled to a pair of complementary sense lines D 205-1 and D_205-2. The latch 215 can be a cross coupled latch. For example, the gates of a pair of transistors, such as n-channel transistors 227-1 and 227-2, e.g., NMOS transistors, can be cross coupled with the gates of another pair of transistors, such as p-channel transistors 229-1 and 229-2, e.g., PMOS transistors. As described further herein, the latch 215 comprising transistors 227-1, 227-2, 229-1, and 229-2 can be referred to as a primary latch. However, embodiments are not limited to this example.

The voltages and/or currents on the respective sense lines 205-1 and 205-2 can be provided to the respective latch inputs 233-1 and 233-2 of the cross coupled latch 215, e.g., the input of the primary latch. In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1.

In this example, a second source/drain region of transistors 227-1 and 227-2 can be commonly coupled to a negative control signal (RNiF) 228. A second source/drain region of transistors 229-1 and 229-2 can be commonly coupled to an active positive control signal (ACT) 265. The ACT signal 265 can be a supply voltage, e.g., $V_{DD}$, and the RNiF signal can be a reference voltage, e.g., ground. RNiF signal 228 and ACT signal 265 can function as activating signals that enable the cross coupled latch 215.

The enabled cross coupled latch 215 can operate to amplify a differential voltage between latch input 233-1, e.g., first common node, and latch input 233-2, e.g., second common node, such that latch input 233-1 is driven to one of the ACT signal voltage and the RNiF signal voltage, e.g., to one of $V_{DD}$ and ground, and latch input 233-2 is driven to the other of the ACT signal voltage and the RNiF signal voltage. The ACT signal voltage and the RNiF signal voltage may correspond to the full rail voltages for conversion of the sensed voltages from the pair of complementary memory cells to a data value, e.g., a binary 0 or 1 data value, by determination of the voltage differential for a read operation, among other possible operations.

The sense amplifier 206 may also include equilibrate circuitry 214 configured to equilibrate sense line 205-1 and sense line 205-2 in association with, for example, preparing the sense amplifier for a logical operation. In this example, the equilibrate circuitry 214 comprises a transistor 224 having a first source/drain region coupled to a first source/drain region of transistor 225-1 and sense line 205-1. A second source/drain region of transistor 224 can be coupled to a first source/drain region of transistor 225-2 and sense line 205-2. A gate of transistor 224 can be coupled to gates of transistors 225-1 and 225-2.

The second source drain regions of transistors 225-1 and 225-2 can be coupled to an equilibration voltage 238, which can be equal to $V_{DD}/2$, where $V_{DD}$ is a supply voltage associated with the array. The gates of transistors 224, 225-1, and 225-2 can be coupled to control signal 226 (EQ). As such, activating EQ can enable the transistors 224, 225-1, and 225-2, which can effectively short sense line 205-1 to sense line 205-2. Shorting the sense lines as such may substantially equilibrate the sense lines 205-1 and 205-2 to the equilibration voltage $V_{DD}/2$. As described herein, the sense amplifier 206 may be enabled, e.g., fired, to sense and/or store voltage potentials from two complementary memory cells coupled to adjacent sense lines 205-1 and 205-2, which may be on both sides of the sense amplifier 206.

Figure 2B:
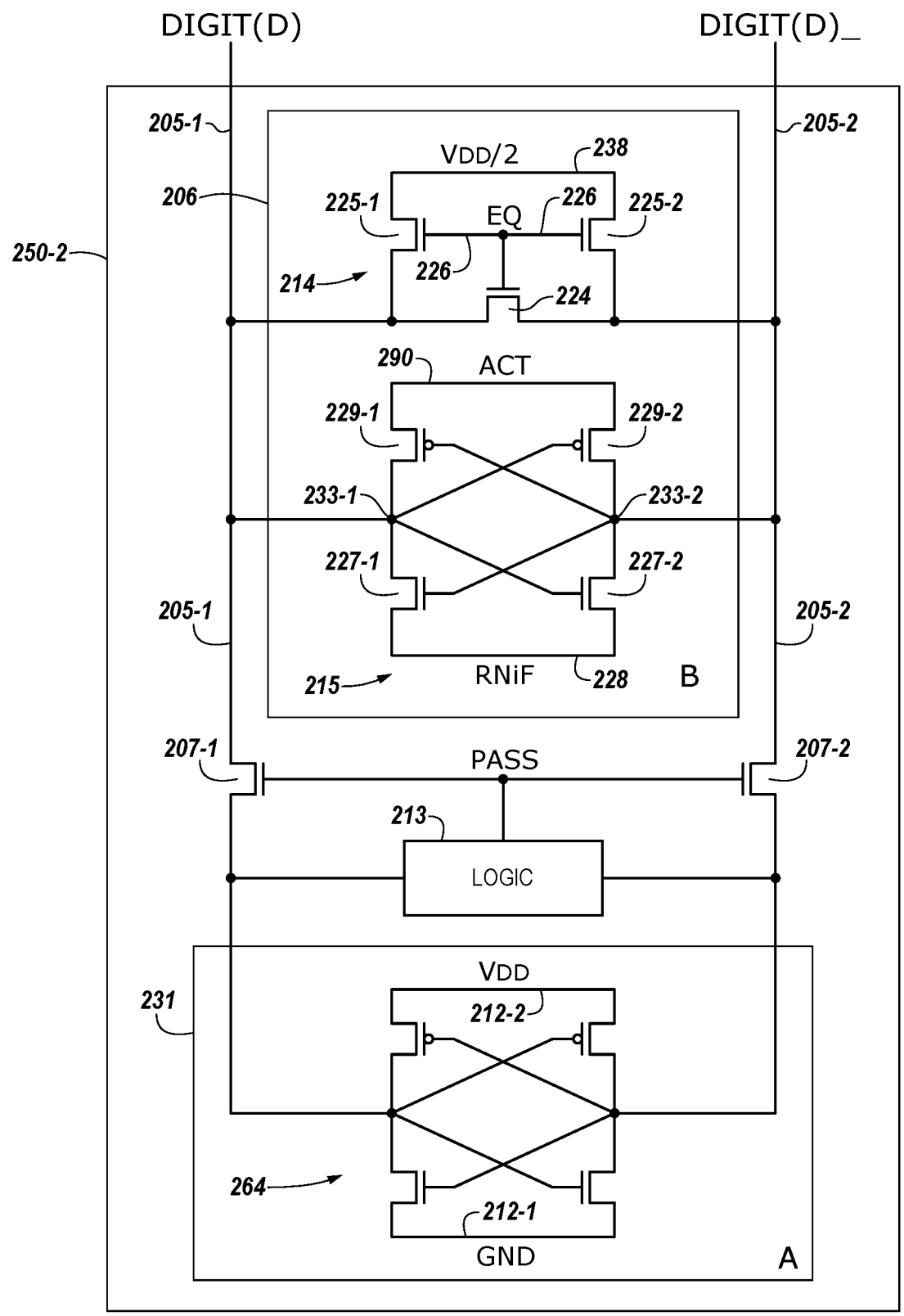

FIG. 2B is another schematic diagram illustrating sensing circuitry 250-2 in accordance with a number of embodiments of the present disclosure. FIG. 2B indicates that a number of sense amplifiers 206 can be coupled to respective pairs of complementary sense lines 205-1 and 205-2, and a corresponding number of compute components 231 can be coupled to the sense amplifiers 206 via pass gates 207-1 and 207-2. The sense amplifier 206 and compute component 231 shown in FIG. 2B can correspond to the sensing circuitry associated with the plurality of sensing component stripes 124 shown in FIG. 1, for example, and/or to sensing circuitry 850 shown in FIG. 8. The sensing circuitry 250-2 shown in FIG. 2B includes logical operation selection logic 213, which can be operated as described further below.

As shown in FIG. 2B, the sensing circuitry 250-2 can comprise a sense amplifier 206, a compute component 231, and logical operation selection logic 213 corresponding to a respective column of memory cells, e.g., coupled to respective pairs of complementary sense lines. The sense amplifiers 206 can be configured, for example, as described with respect to FIG. 2A. The sensing circuitry 250-2 can be operated in both a pre-sensing mode, e.g., sense amplifiers 206 fired before logical operation control signal active, and post-sensing mode, e.g., sense amplifiers 206 fired after logical operation control signal active, with a result of a logical operation performed by the compute component 231 being initially stored in the sense amplifier 206.

As shown in FIG. 2B, the compute component 231 can comprise a latch, which can be referred to herein as a secondary latch 264. The secondary latch 264 can be configured and operated in a manner similar to that described above with respect to the primary latch 215. In some embodiments, a pair of cross coupled p-channel transistors, e.g., PMOS transistors, included in the secondary latch can have their respective sources coupled to a supply voltage 212-2, e.g., $V_{DD}$, and the pair of cross coupled n-channel transistors, e.g., NMOS transistors, of the secondary latch can have their respective sources selectively coupled to a reference voltage 212-1, e.g., ground, such that the secondary latch 264 may be continuously enabled. In a number of embodiments, the secondary latch 264 of the compute component 231 can serve as an accumulator. As such, the compute component 231 can operate as and/or may be referred to herein as an accumulator. The configuration of the compute component 231 is not limited to that shown in FIG. 2B, and various other embodiments are feasible within the scope of the present disclosure.

The gates of the pass gates 207-1 and 207-2 can be controlled by a logical operation selection logic signal, Pass. For example, an output of the logical operation selection logic 213 can be coupled to the gates of the pass gates 207-1 and 207-2.

Data values present on the pair of complementary sense lines 205-1 and 205-2 can be loaded into the compute component 231 via the pass gates 207-1 and 207-2. When the pass gates 207-1 and 207-2 are OPEN, data values on the pair of complementary sense lines 205-1 and 205-2 may be passed to the compute component 231. The data value on the pair of complementary sense lines 205-1 and 205-2 can be the data value stored at least temporarily in the sense amplifier 206 when the sense amplifier is enabled, e.g., fired. The logical operation selection logic signal, Pass, is activated to OPEN, e.g., turn on, the pass gates 207-1 and 207-2.

The control signals can operate to select a logical operation to implement based on the data value ("B") in the sense amplifier 206 and the data value ("A") in the compute component 231, e.g., as used herein, the data value stored in a primary latch of a sense amplifier is referred to as a "B" data value, and the data value stored in a secondary latch of a compute component is referred to as an "A" data value. In particular, the control signals may be configured to select the logical operation, e.g., function, to implement independent from the data value present on the pair of complementary sense lines 205-1 and 205-2, although the result of the implemented logical operation can be dependent on the data value present on the pair of complementary sense lines 205-1 and 205-2.

Although not shown in FIG. 2B, each column of memory cells can be coupled to a column decode line that can be activated to transfer, via a local input/output (I/O) line, a data value from a corresponding sense amplifier 206 and/or compute component 231 to a control component external to the array such as an external processing resource, e.g., host processor and/or other functional unit circuitry. The column decode line can be coupled to a column decoder, e.g., column decoder 652 in FIG. 6. However, as described herein, data need not be transferred via such I/O lines to perform logical operations. For example, circuitry can be operated in conjunction with sense amplifiers 206 and compute components 231 to perform logical operations without transferring data to a control component external to the array. As used herein, transferring data can include, for example, moving data from a source location to a destination location without necessarily maintaining a copy of the data at the source location.

In operation, a data value on a pair of complementary sense lines, e.g., 205-1/205-2, can be loaded into a corresponding compute component 231, e.g., by operating logical operation selection logic as described above. For example, a data value can be loaded into a compute component 231 via overwriting of the data value currently stored in the compute component 231 with the data value stored in the corresponding sense amplifier 206.

The sensing circuitry 250-2 in FIG. 2B can be operated in several modes to perform logical, e.g., bit vector and/or PIM, operations, including a first mode in which a result of the logical operation is initially stored in the sense amplifier 206, and a second mode in which a result of the logical operation is initially stored in the compute component 231. For example, if the sense amplifier 206 is equilibrated and the control signals are activated to provide a conduction path, e.g., electrical continuity, between the sense amplifier 206 and the compute component 231, then a data value stored in the compute component 231 can be transferred from the compute component 231 to the sense amplifier 206. If the sense amplifier 206 is configured to store a first bit, e.g., first data value, and the control signals are activated to provide a conduction path between the sense amplifier 206 and the compute component 231, then a second bit, e.g., second data value, that is stored in the compute component 231 before the activation of the control signals can be replaced by the first bit and the sense amplifier 206 retains the first bit. Furthermore, a number of bit vector and/or PIM operations can be performed using the first bit and the second bit using the logical operation selection logic and the result of the operation can be stored in the compute component 231.

As described herein, the sense amplifier 206 can, in some embodiments in conjunction with the compute component 231, be operated to perform various logical operations, e.g., using data and/or residual voltages from an array as input. In a number of embodiments, the result of a logical operation can be stored back to the array without transferring the data via a data line address access, e.g., without firing a column decode signal such that data is transferred to circuitry external to the array and sensing circuitry via local I/O lines. As such, a number of embodiments of the present disclosure can enable performing various PIM operations, e.g., bit vector operations, logical operations, shift operations, mathematical operations, data movement operations using shared I/O lines, etc., using less power than various previous approaches. Additionally, because a number of embodiments can reduce or eliminate moving, e.g., copying, transferring, data across I/O lines in order to perform operations, e.g., between memory and a discrete processor, which may be off pitch, a number of embodiments may enable an increased parallel processing capability as compared to previous approaches.

Figure 3:
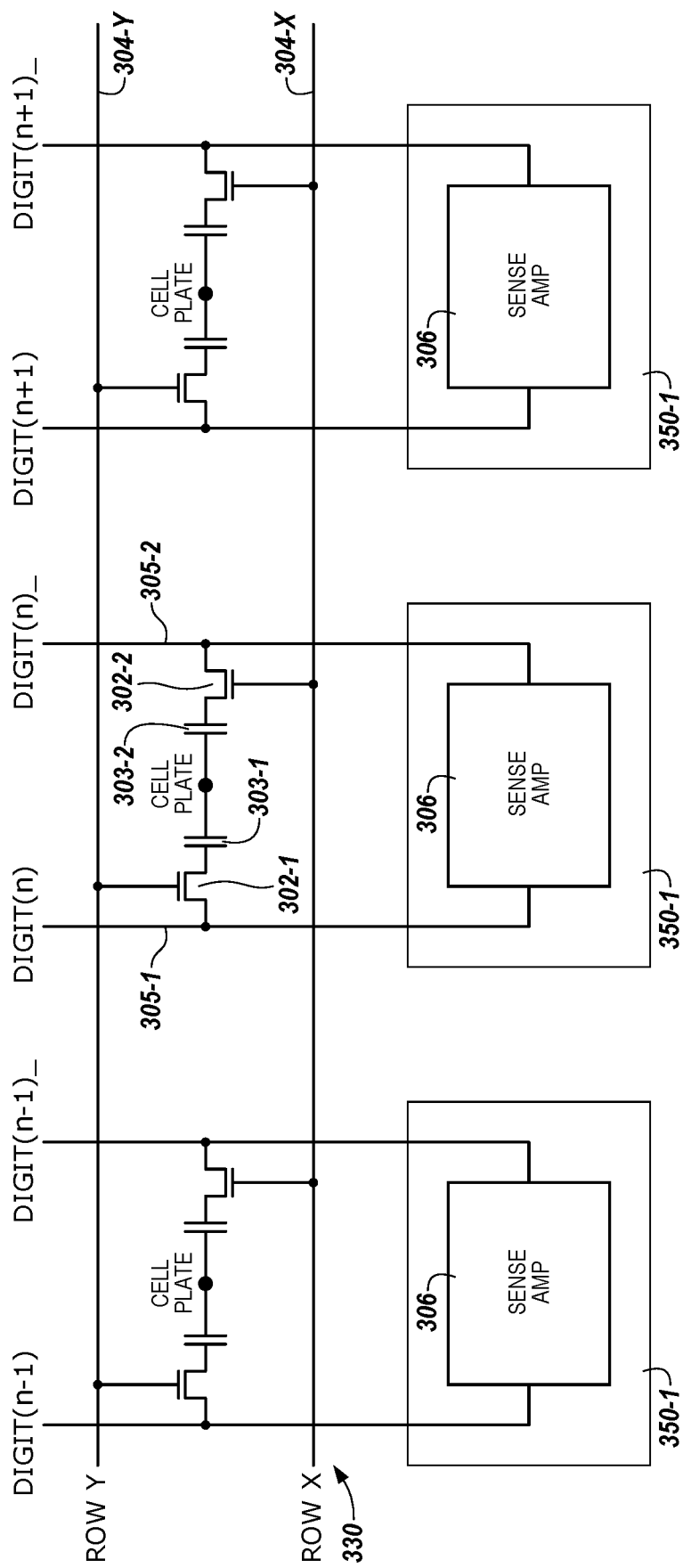
FIG. 3 is a schematic diagram of a memory device in accordance with a number of embodiments of the present disclosure.

FIG. 3 is a schematic diagram of a memory device in accordance with a number of embodiments of the present disclosure. In the embodiment illustrated in FIG. 3, the memory array 330 is an array, for example a DRAM array, of paired 1T1C memory cells that can each include an access device 302, e.g., a transistor, and a storage element 303, e.g., a capacitor, to form a 2T2C memory cell. The 2T2C memory cells of the memory array 330 can be arranged in rows, e.g., as shown at 119 and described in connection with FIG. 1, coupled by access lines 304-X (Row X), 304-Y (Row Y), etc., and columns coupled by pairs of complementary sense lines DIGIT(n−1)/DIGIT(n−1)_, DIGIT(n)/DIGIT(n)_, and DIGIT(n+1)/DIGIT(n+1)_, etc. The individual sense lines corresponding to each pair of complementary data lines can be referred to as sense lines 305-1 (DIGIT(n)) and 305-2 (DIGIT(n)_) respectively. Although only three pairs of complementary sense lines are shown in FIG. 3, embodiments of the present disclosure are not so limited, and an array of memory cells may include additional columns of memory cells and/or sense lines, e.g., 4,096, 8,192, 16,384, etc.

As shown in FIG. 3, a gate of a particular memory cell transistor 302 can be coupled to its corresponding access line 304-X, 304-Y, etc., a first source/drain region can be coupled to its corresponding data line, e.g., 305-1 (DIGIT(n), 305-2 (DIGIT(n)_), and a second source/drain region of a particular memory cell transistor can be coupled to its corresponding capacitor 303.

Memory cells can be coupled to different sense lines and/or access lines. For example, a first source/drain region of a transistor 302-1 can be coupled to sense line 305-1, a second source/drain region of transistor 302-1 can be coupled to capacitor 303-1, and a gate of a transistor 302-1 can be coupled to access line 304-Y. A first source/drain region of transistor 302-2 can be coupled to sense line 305-2, a second source/drain region of transistor 302-2 can be coupled to capacitor 303-2, and a gate of a transistor 302-2 can be coupled to access line 304-X. The cell plate, as shown in FIG. 3, can be coupled to each of capacitors 303-1 and 303-2. The cell plate can be a common node to which a reference voltage, e.g., ground, can be applied in various memory array configurations.

As described herein, the transistors 302 and capacitors 303 can contribute to formation of the pairs of complementary memory cells, e.g., 2T2C memory cells, in a single row of the memory array that are coupled to the complementary sense lines, e.g., sense lines 305-1 and 305-2. The number of data values, e.g., voltages, sensed from the memory cells in sense operations may correspond to the number of columns of memory cells and/or pairs of sense lines, e.g., 4,096, 8,192, 16,384, etc., that intersect a row, for example, of a section 125 shown in and described in connection with FIG. 1. In various embodiments, each section may include 256, 512, 1024 rows, among other possible numbers of rows, and each bank section may be divided into 32, 64, or 128 sections, among various possibilities.

The memory array 330 illustrated in FIG. 3 is coupled to sensing circuitry 350 in accordance with a number of embodiments of the present disclosure. In some embodiments, the sensing circuitry 350-1 may include a 2T2C sense amplifier 306 corresponding to respective columns of memory cells, e.g., coupled to respective pairs of complementary data lines 305-1, 305-2, but does not additionally include a compute component, e.g., 231 shown in FIG. 2B. However, embodiments are not so limited. For example, some embodiments of the sensing circuitry (not shown) may include a compute component that can perform compute and/or accumulator functionalities. The sensing circuitry 350 can correspond to sensing circuitry described in connection with the sensing component stripes 124 in FIG. 1, for example, and/or to sensing circuitry 850 shown in FIG. 8.

The sense amplifier 306 can correspond to sense amplifier 206 described previously with respect to FIGS. 2A-2B. The sense amplifier 306 can be operated to determine a data value stored in, e.g., a logic state, and/or a residual voltage at a selected memory cell, which may be represented by the voltages present on the complementary sense lines 305-1, 305-2.

Figure 4A:
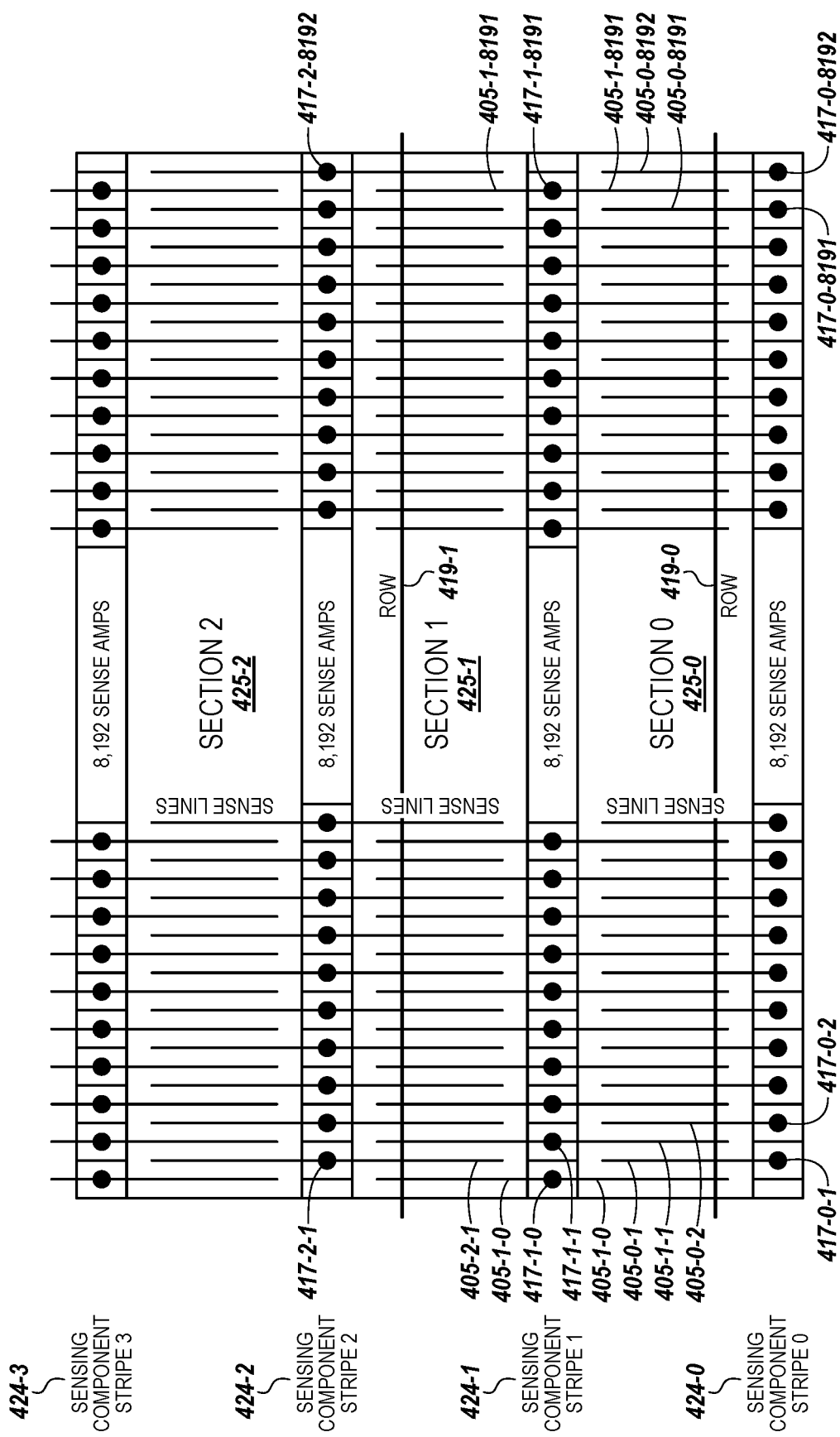
FIG. 4A is a block diagram of sections in a bank of a memory device in a one transistor, one capacitor (1T1C) configuration in accordance with a number of embodiments of the present disclosure.

FIG. 4A is a block diagram of sections, e.g., section 0 at 425-0, section 1 at 425-1, section 2 at 425-2, etc., in a bank of a memory device in a 1T1C configuration in accordance with a number of embodiments of the present disclosure. FIG. 4A shows a 1T1C DRAM architecture, for example. However embodiments of the present disclosure can use an 2T2C DRAM architecture. When row 419-1 in section 425-1 is selected and opened, e.g., fired by execution of a fire row command, 8192 1T1C sense amplifiers, e.g., 417-1-0, 417-1-1, . . . , 417-1-8191, in sensing component stripe 1 at 424-1 and 8192 sense amplifiers, e.g., 417-2-1, 417-2-2, . . . , 417-2-8192, in sensing component stripe 2 at 424-2 may be enabled, e.g., fired, to sense and/or store voltage potentials from two portions of a sense line, e.g., 405-1 and 405-2, coupled to each of the sense amplifiers.

As shown in section 425-1, portions of sense lines coupled to sense amplifiers 417-1-0, 417-1-1, . . . , 417-1-8191 that intersect with row 419-1, e.g., sense lines 405-1-0, 405-1-1, . . . , 405-18191, extend upward through section 425-1 toward row 419-1, where the sense line may be selectably coupled to a particular 1T1C memory cell, e.g., as shown at 418-1-0, 418-1-1, . . . , etc., in row 419-1. A complementary portion of each of the sense lines, e.g., sense lines 405-1-0, 405-1-1, . . . , 405-18191 coupled to and extending downward from the sense amplifiers 417-1-0, 417-1-1, . . . , 417-1-8191 into section 425-0 may be used by the sense amplifier to sense a reference, e.g., residual, voltage on the sense line when the sense line is not coupled to a memory cell in section 425-0, e.g., the sense line is open. The residual voltage on the open sense line in section 425-0 may be used as a reference to determine a data value corresponding to the voltage sensed on the memory cells in row 419-1 of section 425-1. The sense amplifiers 417-2-1, 417-2-2, . . . , 417-2-8192 in sensing component stripe 424-2 may be similarly coupled to portions of sense lines in section 425-1 that intersect row 419-1 and portions of the sense lines that extend into section 425-2 to serve as references to determine the data values of the remaining memory cells in row 419-1. As such, the combination of 16,384 sense amplifiers in sensing component stripes 424-1 and 424-2 may sense and latch, e.g., store, data values from the 16,384 memory cells associated with row 419-1.

In some embodiments, half of the sense lines in section 425-1 may be coupled to sense amplifiers in sensing component stripe 424-1, while the other half of the sense lines in section 425-1 may be coupled to sense amplifiers in sensing component stripe 424-2, e.g., configured as interlaced sense lines. The reference sense lines for the sense amplifiers in sensing component stripe 424-1 are in section 425-0, while the reference sense lines for the sense amplifiers in sensing component stripe 424-2 are in section 425-2. Utilization of such neighboring, e.g., adjacent, sections for reference sense lines may continue throughout a memory array, e.g., DRAM architecture.

Figure 4B:
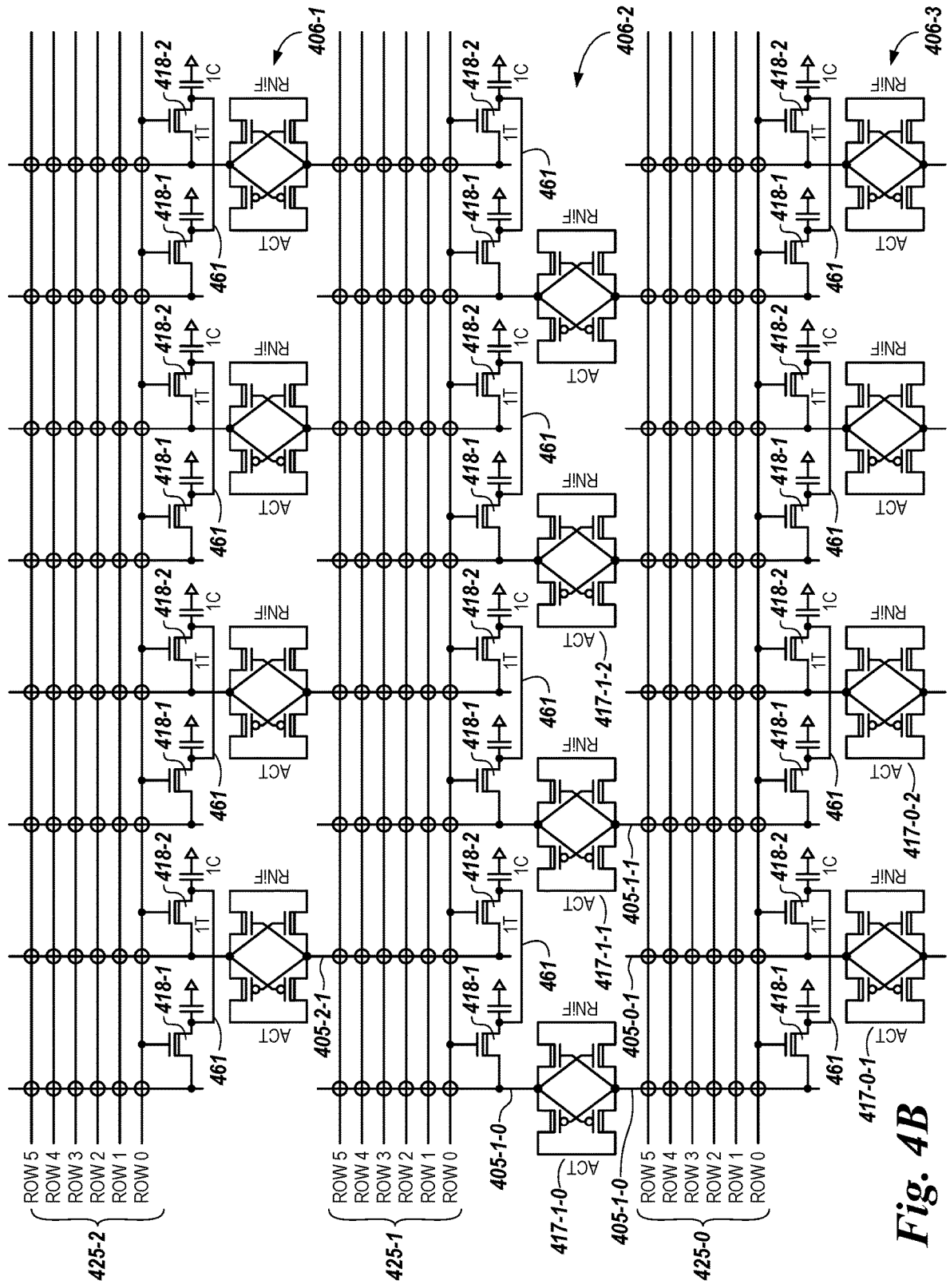
FIG. 4B is a schematic diagram illustrating an example of memory device circuitry in the 1T1C configuration in accordance with a number of embodiments of the present disclosure.

FIG. 4B is a block diagram of sections, e.g., subarrays, in a bank of a memory device in a 1T1C configuration in accordance with a number of embodiments of the present disclosure. A first portion of memory cells, e.g., memory cells coupled to even digit lines, of the subarray 425-0 are coupled to sensing circuitry stripe 406-0. A second portion of memory cells, e.g., memory cell coupled to odd digit lines, of the subarray 425-0 are coupled to sensing circuitry stripe 406-1. A first portion of memory cells, e.g., memory cells coupled to even digit lines, of the subarray 425-1 are coupled to sensing circuitry stripe 406-1. A second portion of memory cells, e.g., memory cell coupled to odd digit lines, of the subarray 425-1 are coupled to sensing circuitry stripe 406-2.

The memory cells in row 0 of subarrays 425-0, 425-1, and 425-2 include adjacent memory cells that are coupled together. For example, each subarray has a row were each memory cell in the row coupled to an even digit line is coupled to an adjacent memory coupled to an odd digit line. The memory cells 418-1 in row 0 of a subarray, which are coupled to odd digits lines, are coupled to memory cells 418-2 in row 0 of the subarray, which are coupled to even digit lines, via connection 461. Each subarray has a row where memory cells in a first portion of memory cells, e.g., memory cells 418-1 coupled to odd digit lines, are coupled to adjacent memory cells in a second portion of memory cells, e.g., memory cells 518-2 coupled to even digit lines. Therefore, when opening the row where memory cells in the first portion of memory cells are coupled to adjacent memory cells in the second portion of memory cells, the data will be stored the first and second portion of memory cells.

Data stored in a first subarray, e.g., subarray 425-2, can be transferred to other subarrays, e.g., subarrays 425-0, and 425-1, without transferring the data off of the array. Data stored in a row of subarray 425-2 can be transferred to a row of subarray 425-0, for example. Data can be transferred by moving data to an adjacent subarray via their common sensing circuitry stripe, shifting the data to an adjacent portion of memory cells, and moving the data to another subarray via another sensing circuitry stripe common the adjacent portion of memory cells.

For example, data can be transferred from row 4 in subarray 425-2 by activating row 4 of subarray 425-2 with a control signal and activing sensing circuitry stripe 406-2 with control signals to store the data from row 4 in subarray 425-2 in sensing circuitry stripe 406-2. The data from row 4 is stored in a node of sensing circuitry stripe 406-2 coupled to subarray 425-2, while the complement of the data from row 4 is stored in a node of sensing circuitry stripe 406-2 coupled to subarray 425-1. The complement of the data is transferred to subarray 425-1 by activating row 0 of subarray 425-1 with a control signal to move the complement of the data to memory cells coupled to sensing circuitry stripe 406-2 and to memory cells coupled to sensing circuitry stripe 406-1 due to adjacent memory cells in row 0 of subarray 425-1 that are coupled to different sensing circuitry stripes being coupled together. The complement of the data is transferred to sensing circuitry stripe 406-1 by activating sensing circuitry stripe 406-1 with control signals to store the complement of the data in sensing circuitry stripe 406-1. The complement of the data is stored in a node of sensing circuitry stripe 406-1 coupled to subarray 425-1, while the data from row 4 of subarray 425-1 is stored in a node of sensing circuitry stripe 406-1 coupled to subarray 425-0. The data is transferred to subarray 425-0 by activating row 0 of subarray 425-0 with a control signal to move the data to memory cells coupled to sensing circuitry stripe 406-1 and to memory cells coupled to sensing circuitry stripe 406-0 due to adjacent memory cells in row 0 of subarray 425-0 that are coupled to different sensing circuitry stripes being coupled together. The data can then be stored in subarray 425-0 by activating sensing circuitry stripe 406-0 with control signals to store the data in sensing circuitry stripe 406-0 and activating row 4, for example, in subarray 425-0 to transfer the data to memory cells in row 4 of subarray 425-0 coupled to sensing circuitry stripe 406-0. The memory cells in memory cells in row 4 of subarray 425-0 coupled to sensing circuitry stripe 406-0 are storing the data originally from the memory cells in row 4 of subarray 425-2 coupled to sensing circuitry stripe 406-2.

The process of moving data and/or the complement of the data to an adjacent subarray via shared sensing circuitry stripes, shifting the data and/or the complement of the data to an adjacent portions of memory cells in the adjacent subarray coupled to a different sensing circuitry stripe, and moving the data and/or the complement of the data to the different sensing stripe can be used any number of times to transfer data and/or the complement of the data to various subarrays in an array of memory cells.

Figure 5:
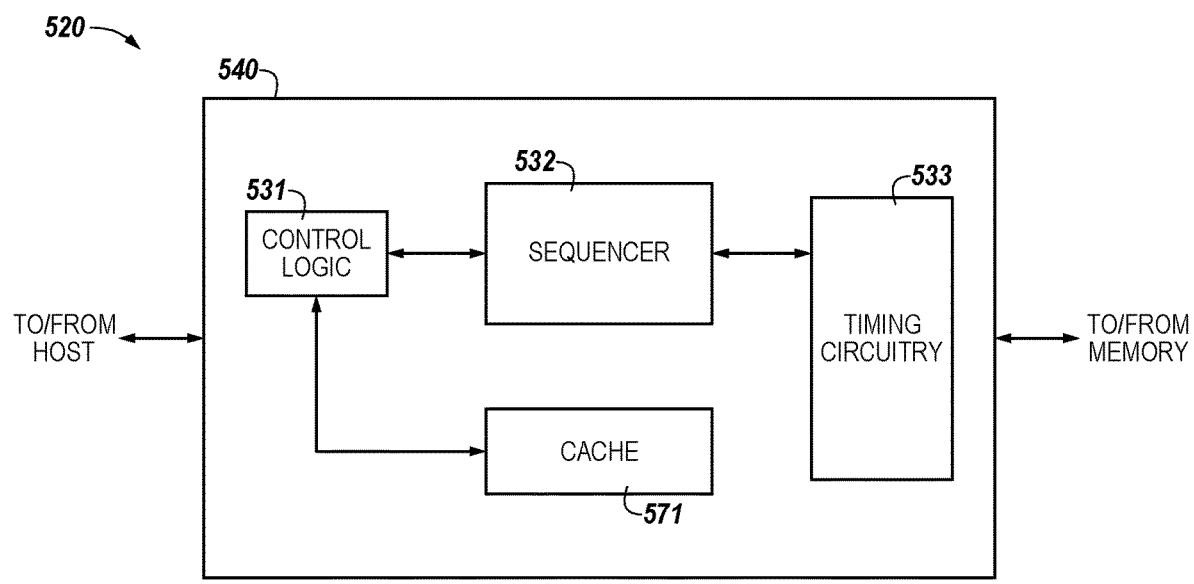
FIG. 5 is a block diagram in greater detail of a controller in accordance with a number of embodiments of the present disclosure.

FIG. 5 is a block diagram in greater detail of controller 140 and 640 shown in and described in connection with FIG. 1 and FIG. 6, and elsewhere herein, in accordance with a number of embodiments of the present disclosure. In the example shown in FIG. 5, the controller 540 is shown to include control logic 531, sequencer 532, and timing circuitry 533 as part of a controller 540 of a memory device 520. Memory device 520 can include a controller 540 on each bank of the memory device and can be referred to as a bank process control unit (BPCU).

Figure 6:
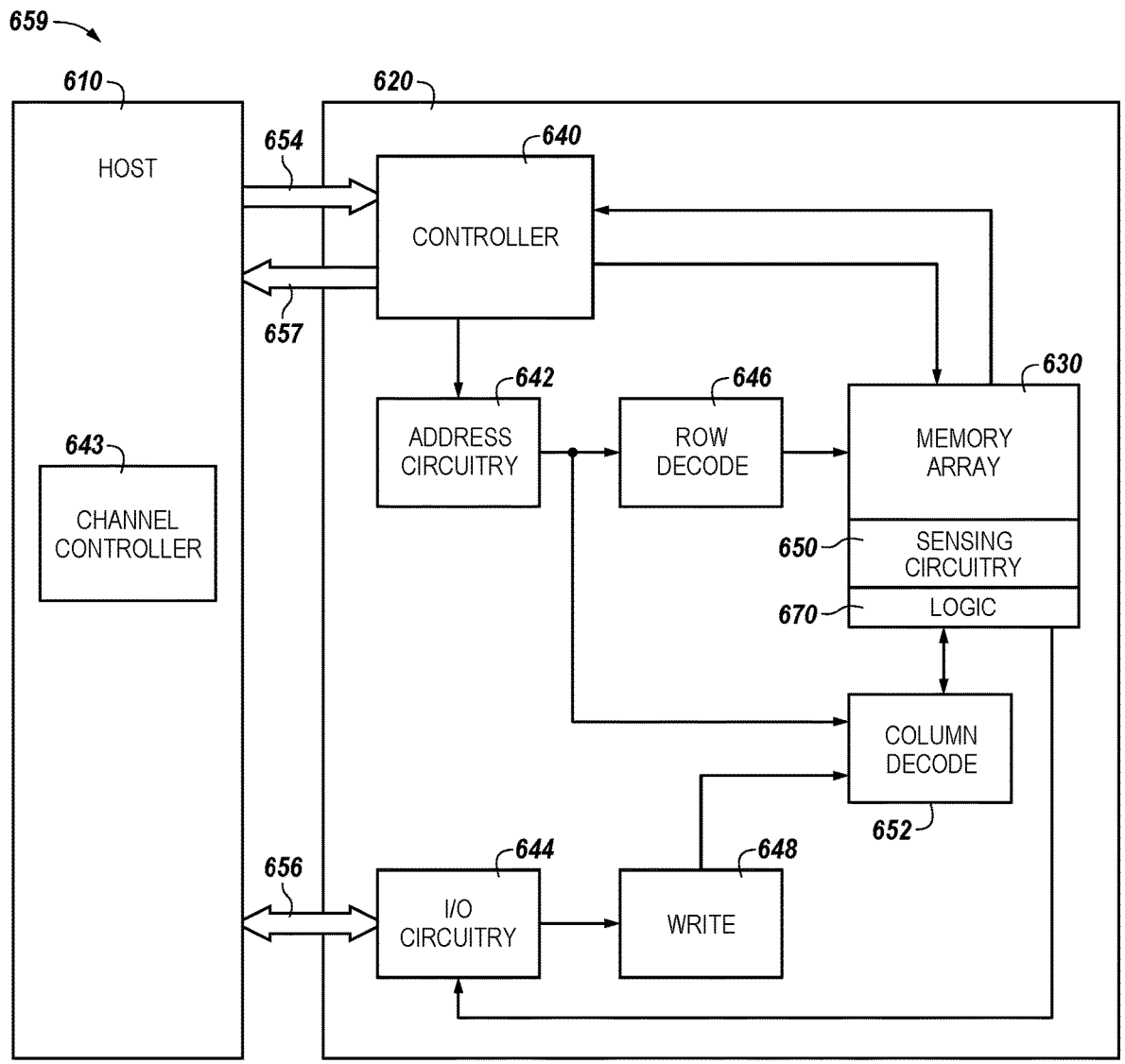
FIG. 6 is a block diagram of an apparatus in the form of a computing system including a memory device in accordance with a number of embodiments of the present disclosure.

In the example shown in FIG. 5, the control logic 531 may be in the form of a microcode engine responsible for fetching and executing machine instructions, e.g., microcode instructions, from an array of memory cells, e.g., an array as array 630 in FIG. 6. The sequencer 532 may also be in the form of a number of microcode engines and/or ALU circuitry. Alternatively, the control logic 531 may be in the form of a very large instruction word (VLIW) type processing resource and the sequencer 532, and the timing circuitry 533 may be in the form of state machines and transistor circuitry.

The control logic 531 may receive microcode instructions (bits) from the memory array 830, e.g., as shown in and described in connection with FIG. 6B, via the data line 645. In some embodiments, the microcode instructions may be initially stored in cache 571. The control logic 531 may decode the microcode instructions into function calls, e.g., microcode function calls (uCODE), implemented by the sequencers 532. The microcode function calls can be the operations that the sequencer 532 receives and executes to cause the memory device 520 to perform particular compute and/or logical operations, e.g., using sensing circuitry, such as sensing circuitry 650 in FIG. 6. The timing circuitry 533 may provide timing to coordinate performance of the compute and/or logical operations and be responsible for providing conflict free access to the arrays such as array 830 shown in FIG. 8.

As described in connection with FIG. 6, the controller 540 may be coupled to sensing circuitry 650 and/or additional logic circuitry 670, including cache, buffers, sense amplifiers, compute components, extended row address (XRA) latches, and/or registers, associated with arrays of memory cells via control lines and data paths shown in FIGS. 2A-2B and 6. As such, the sensing circuitry 650 and logic 670 shown in FIG. 6 can be associated with, e.g., coupled to, the arrays of memory cells 630 in various ways, including by data lines 425. The controller 540 may control regular DRAM compute operations for the arrays such as a read, write, copy, and/or erase operations, etc. Additionally, however, microcode instructions retrieved and executed by the control logic 531 and the microcode function calls received and executed by the sequencer 532 can cause sensing circuitry 650 shown in FIG. 6 to perform additional logical operations such as addition, multiplication, or, as a more specific example, Boolean operations such as an AND, OR, XOR, etc., which are more complex than regular DRAM read and write operations. In various embodiments, compute and/or logical operations may be performed using the sense amplifier 206 and/or compute component 231 of the sensing circuitry shown in and described in connection with FIGS. 2A-2B. Hence, in this memory device 520 example, microcode instruction execution, compute operations, and/or logical operations may be performed on the memory device 520 as enabled by the microcode instructions (bits) being moved as described herein from the array of memory cells 630 to the controller 540 for execution by the microcode engine.

As such, the control logic 531, sequencer 532, and timing circuitry 533 may operate to generate sequences of operation cycles for a DRAM array. In the memory device 520 example, each sequence may be designed to perform operations, such as a Boolean logical operations AND, OR, XOR, etc., which together achieve a specific function. For example, the sequences of operations may repetitively perform a logical operation for a one (1) bit add in order to calculate a multiple bit sum. Each sequence of operations may be fed into a first in/first out (FIFO) buffer coupled to the timing circuitry 533 to provide timing coordination with the sensing circuity 650 and/or additional logic circuitry 670 associated with the array of memory cells 630, e.g., DRAM arrays, shown in FIG. 6.

In the example memory device 520 shown in FIG. 5, the timing circuitry 533 may provide timing and provide conflict free access to the arrays from, for example, four (4) FIFO queues. In this example, one FIFO queue may support array computation, one may be for instruction fetch, one for microcode, e.g., uCODE, instruction fetch, and one for DRAM I/O. Both the control logic 531 and the sequencer 532 can generate status information, which can be routed back to a bank arbiter via a FIFO interface. The bank arbiter may aggregate this status data and report it back to a host 610.

FIG. 6 is a block diagram of an apparatus in the form of a computing system 659 including a memory device 620 in accordance with a number of embodiments of the present disclosure. As used herein, a memory device 8620, controller 640, memory array 630, sensing circuitry 6850, and/or logic 670 might also be separately considered an "apparatus."

In previous approaches, data may be transferred from a memory array and sensing circuitry, e.g., via a bus comprising I/O lines, to a processing resource such as a processor, microprocessor, and/or compute engine, which may comprise ALU circuitry and/or other functional unit circuitry configured to perform the appropriate operations. However, transferring data from the memory array and sensing circuitry to such processing resource(s) can involve significant time and/or power consumption. Even if the processing resource is located on a same chip as the memory array, significant power can be consumed in moving data out of the array to the compute circuitry, which can involve performing a sense line (which may be referred to herein as a digit line or data line) address access, e.g., firing of a column decode signal, in order to transfer data from sense lines onto I/O lines, e.g., local I/O lines, transferring the data peripheral to the array, which may be transferred to a cache in a host, and providing the data to the peripheral compute circuitry.

In a number of embodiments, sensing circuitry 650 can be used to perform logical operations using data stored in an array of memory cells, e.g., array 630, as inputs and store the results of the logical operations back to the array 630 without transferring data via a sense line address access. e.g., without firing a column decode signal. As such, various compute functions can be performed using, and within, sensing circuitry 650 rather than (or in association with) being performed by processing resources external to the sensing circuitry, e.g., by a processor associated with host 610 and/or other processing circuitry, such as ALU circuitry, located on device 620, e.g., on controller 640 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines. In contrast, in a number of embodiments of the present disclosure, sensing circuitry 650 may be configured to perform logical operations on data stored in memory array 630 and store the result back to the memory array 630 without enabling an I/O line, e.g., a local I/O line, coupled to the sensing circuitry 850. Additional logic circuitry 670 can be coupled to the sensing circuitry 650 and can be used to store, e.g., cache and/or buffer, results of operations described herein.

The sensing circuitry 650 can be formed on pitch with the memory cells of the array. In some instances, circuitry of processing resource(s), e.g., a compute engine, may not conform to pitch rules associated with a memory array. For example, the memory cells of a memory array may have a $4F^2$ or $6F^2$ cell size, where "F" is a feature size corresponding to the cells. As such, the devices, e.g., logic gates, associated with ALU circuitry of previous PIM systems may not be capable of being formed on pitch with the memory cells, which can affect chip size and/or memory density, for example. A number of embodiments of the present disclosure can include the control circuitry and/or the sensing circuitry, e.g., including sense amplifiers and/or compute components, as described herein, being formed on pitch with the memory cells of the array and being configured to, e.g., being capable of performing, compute functions, e.g., memory and/or PIM operations, on pitch with the memory cells. The sensing circuitry can, in some embodiments, be capable of performing data sensing and compute functions and at least temporary storage, e.g., caching, of data local to the array of memory cells.

PIM capable device operations can use bit vector based operations. As used herein, the term "bit vector" is intended to mean a number of bits on a bit vector memory device, e.g., a PIM device, stored in a row of an array of memory cells and/or in sensing circuitry. Thus, as used herein a "bit vector operation" is intended to mean an operation that is performed on a bit vector that is a portion of virtual address space and/or physical address space, e.g., used by a PIM device. In some embodiments, the bit vector may be a physically contiguous number of bits on the bit vector memory device stored physically contiguous in a row and/or in the sensing circuitry such that the bit vector operation is performed on a bit vector that is a contiguous portion of the virtual address space and/or physical address space.

In some embodiments, a bit vector memory device, e.g., a PIM device capable of performing bit vector operations, may perform logical operations. For example, PIM devices capable of bit vector operations operate on bit vectors. As used herein, the term "bit vector" is intended to mean a physically contiguous number of bits on a bit vector memory device, e.g., PIM device, whether physically contiguous in rows, e.g., horizontally oriented, or columns, e.g., vertically oriented, in an array of memory cells. Thus, as used herein, a "bit vector operation" is intended to mean an operation that is performed on a bit vector that is a contiguous portion (also referred to as "chunk") of virtual address space, e.g., used by a bit vector operation capable memory device. For example, a chunk of virtual address space may have a bit length of 256 bits. A chunk may or may not be contiguous physically to other chunks in the virtual address space. Such bit vector operations may be enabled, e.g., performed, by a combination of a sense amplifier 206 and a compute component 231, e.g., in a 2T2C configuration, as shown in and described in connection with FIGS. 2A-2B. As the reader will appreciate, while a DRAM memory device configuration and/or a DRAM bit vector operation, e.g., performed by a PIM device, is discussed with regard to some examples presented herein, embodiments are not limited to a DRAM and/or PIM DRAM implementation.

For example, a row of virtual address space in the PIM device may have a bit length of 16K bits, e.g., corresponding to 16K complementary pairs of memory cells in a DRAM configuration. Sensing circuitry 650, as described herein, for such a 16K bit row may include a corresponding 16K processing elements, e.g., compute components as described herein, formed on pitch with the sense lines selectably coupled to corresponding memory cells in the 16 bit row. A compute component in the PIM device may operate as a one bit vector processing element on a single bit of the bit vector of the row of memory cells sensed by the sensing circuitry 650, e.g., sensed by and/or stored in a sense amplifier 206 paired with the compute component 231, as described further in connection with FIG. 2B and elsewhere herein.

As such, in a number of embodiments, circuitry external to array 630 and sensing circuitry 650 is not needed to perform compute functions as the sensing circuitry 650 can perform the appropriate memory and/or logical operations in order to perform such compute functions without the use of an external processing resource. Therefore, the sensing circuitry 650 may be used to complement and/or to replace, at least to some extent, such an external processing resource (or at least the bandwidth consumption of such an external processing resource).

However, in a number of embodiments, the sensing circuitry 650 may be used to perform operations, e.g., to execute instructions, in addition to operations performed by an external processing resource, e.g., host 610. For instance, host 610 and/or sensing circuitry 650 may be limited to performing only certain logical operations and/or a certain number of logical operations.

Enabling an I/O line can include enabling, e.g., turning on, a transistor having a gate coupled to a decode signal, e.g., a column decode signal, and a source/drain coupled to the I/O line. However, embodiments are not limited to performing operations using sensing circuitry, e.g., 650, without enabling column decode lines of the array. Whether or not local I/O lines are used in association with performing operations via sensing circuitry 650, the local I/O line(s) may be enabled in order to transfer a result to a suitable location other than back to the array 630, e.g., to an external register.

As described herein, the controller 640 can be configured to direct movement to the component, e.g., ECC circuitry and/or data line, among other possibilities, of the instructions from the first sensing circuitry, e.g., sensing component stripe 424-0, and/or to direct movement to the component of the data value from the second sensing circuitry, e.g., sensing component stripe 424-1.

The computing system 659 illustrated in FIG. 6 can include a host 610 coupled, e.g., connected, to memory device 620, which includes the memory array 630. Host 610 can be a host system such as a personal laptop computer, a desktop computer, a tablet computer, a digital camera, a smart phone, or a memory card reader, among various other types of hosts. Host 610 can include a system motherboard and backplane and can include a number of processing resources, e.g., one or more processors, microprocessors, or some other type of controlling circuitry. The computing system 659 can include separate integrated circuits or both the host 610 and the memory device 620 can be on the same integrated circuit. The computing system 659 can be, for instance, a server system and/or a high performance computing (HPC) system or a portion of either. Although the example shown in FIG. 6 illustrates a system having a Von Neumann architecture, embodiments of the present disclosure can be implemented in non-Von Neumann architectures, which may not include one or more components, e.g., CPU, ALU, etc., often associated with a Von Neumann architecture.

For clarity, description of the computing system 659 has been simplified to focus on features with particular relevance to the present disclosure. For example, in various embodiments, the memory array 630 can be a DRAM array, SRAM array, STT RAM array, PCRAM array, TRAM array, RRAM array, NAND flash array, and NOR flash array, for instance. The memory array 630 can include memory cells arranged in rows coupled by access lines (which may be referred to herein as word lines or select lines) and columns coupled by sense lines (which may be referred to herein as data lines or digit lines). Although a single memory array 630 is shown in FIG. 6, embodiments are not so limited. For instance, memory device 620 may include a number of memory arrays 630, e.g., a number of banks of DRAM cells, NAND flash cells, etc., in addition to a number of sections, e.g., subarrays, as described herein.

The memory device 620 can include address circuitry 642 to latch address signals provided over a data bus 656, e.g., an I/O bus from the host 610, by I/O circuitry 644, e.g., provided to external ALU circuitry and to DRAM DQs via local I/O lines and global I/O lines. As used herein, DRAM DQs can enable input of data to and output of data from a bank, e.g., from and/or to the controller 640 and/or host 610, via a bus, e.g., data bus 156 and/or 656. During a write operation, a voltage (high=1, low=0) can be applied to a DQ, e.g., a pin. This voltage can be translated into an appropriate signal and stored in a selected memory cell. During a read operation, a data value read from a selected memory cell can appear at the DQ once access is complete and the output is enabled, e.g., by the output enable signal being low. At other times, DQs can be in a high impedance state, such that the DQs do not source or sink current and do not present a signal to the system. This also may reduce DQ contention when two or more devices, e.g., banks, share the data bus.

Status and exception information can be provided from the controller 640 on the memory device 620 to the host 610 through, for example, a bus 657, e.g., a high speed interface (HSI) out-of-band (OOB) bus. The bus 657 can be used by the host 110 to dispatch commands, e.g., PIM commands, to a plurality of memory devices 620-1, . . . , 620-N (not shown) to store those program instructions within a given bank of a memory device.

Address signals are received through address circuitry 642 and decoded by a row decoder 646 and a column decoder 652 to access the memory array 630. Data can be sensed (read) from memory array 630 by sensing voltage and/or current changes on sense lines (digit lines in FIGS. 2A-2B and 3), for example, using a number of sense amplifiers of the sensing circuitry 650. A sense amplifier can read and latch data values from a page, e.g., a row, of data from the memory array 630. Additional compute components, e.g., as shown at 231 and described in connection with FIG. 2B, can be coupled to the sense amplifiers and can be used in combination with the sense amplifiers to sense, store, e.g., cache and buffer, perform compute functions, e.g., operations, on, and/or move data. The I/O circuitry 644 can be used for bi-directional data communication with host 610 over the data bus 656, e.g., a 64 bit wide data bus. The write circuitry 648 can be used to write data to the memory array 630.

Controller 640, e.g., bank control logic and sequencer, can decode signals, e.g., commands, provided by control bus 654 from the host 610. These signals can include chip enable signals, write enable signals, and/or address latch signals that can be used to control operations performed on the memory array 630, including data sense, data store, data movement, data compute (PIM), data read, data write, and/or data erase, among other operations. Control circuitry having instructions, e.g., stored in hardware, such as an application-specific integrated circuit (ASIC), firmware, and/or software embodiments, can be associated with the controller 640. In various embodiments, the controller 640 can be responsible for issuing instructions from the host 610 and accessing the memory array 630. The controller 640 can be a state machine, a sequencer, or some other type of controller. The controller 640 can control shifting data, e.g., right or left, in a row of an array, e.g., memory array 630.

Examples of the sensing circuitry 650 are described in connection with FIGS. 2A-2B. For instance, in various embodiments, the sensing circuitry 650 can include a number of sense amplifiers and/or a number of compute components. A compute component may serve as an accumulator and can be used to perform operations as directed by a controller 640 and/or a respective section controller (not shown) of each section, e.g., on data associated with complementary sense lines. In some embodiments, a compute component can be coupled to each sense amplifier, e.g., as shown at 231 and 206, respectively, in FIG. 2B, within the sensing circuitry 650 in each respective sensing component stripe coupled to a section, e.g., in sensing component stripes 124-0 and 124-1 coupled respectively to sections 125-0 and 125-1 shown in and described in connection with FIG. 1 and elsewhere. However, embodiments are not so limited. For example, in some embodiments, there may not be a 1:1 correlation between the number of sense amplifiers and compute components. For example, there may be more than one sense amplifier per compute component or more than one compute component per sense amplifier, which may vary between sections, banks, etc.

In a number of embodiments, the sensing circuitry 650 can be used to perform operations using data stored in memory array 630 as input and participate in movement of the data for reading, writing, logical, copy, transfer, and/or storage operations to a different location in the memory array 630 without transferring the data via a sense line address access, e.g., without firing a column decode signal. As such, various compute functions (PIM operations) can be performed using, and within, the sensing circuitry 650 rather than (or in association with) being performed by processing resources external to the sensing circuitry 650, e.g., by a processor associated with host 610 and other processing circuitry, such as ALU circuitry, located on device 620, such as on controller 640 or elsewhere.

In various previous approaches, data associated with an operand, for instance, would be read from memory via sensing circuitry and provided to external ALU circuitry via I/O lines, e.g., via local I/O lines and/or global I/O lines. The external ALU circuitry could include a number of registers and would perform compute functions using the operands, and the result would be transferred back to the array via the I/O lines.

In contrast, as described herein, sensing circuitry 650 is configured to perform operations on data stored in memory array 630 and to store the result back to the memory array 630 without enabling a local I/O line and global I/O line coupled to the sensing circuitry 650. The sensing circuitry 650 can be formed on pitch with the memory cells of the array. Additional peripheral sense amplifiers and/or logic 670, e.g., section controllers that each execute instructions for performing a respective operation, can be coupled to the sensing circuitry 650. The sensing circuitry 650 and the peripheral sense amplifier and/or logic 670 can cooperate in performing operations, according to some embodiments herein.

Logic, as described herein, is intended to mean hardware, e.g., in the form of an application specific integrated circuit (ASIC), and/or firmware to implement one or more particular functions. One example of logic may include a state machine, as described herein. Another example may include an embedded processing resource. Logic can include instructions, e.g., PIM commands and/or instructions, such as ECC code and/or microcode, that can be sent to a memory device having processing capabilities to implement logical operations. As such, the logic may be associated with, e.g., located at and/or connected to, the host 610, the controller 640, and/or the memory array 630, e.g., at logic 670.

Hence, in a number of embodiments, circuitry external to memory array 630 and sensing circuitry 650 is not needed to perform compute functions, as the sensing circuitry 650 can perform the appropriate operations in order to perform such compute functions, e.g., in a sequence of instructions, without the use of an external processing resource. Therefore, the sensing circuitry 650 may be used to complement or to replace, at least to some extent, such an external processing resource (or at least reduce the bandwidth consumption of transfer of data to and/or from such an external processing resource).

In a number of embodiments, the sensing circuitry 650 may be used to perform operations, e.g., to execute a sequence of instructions, in addition to operations performed by an external processing resource, e.g., host 610. For example, either of the host 610 and the sensing circuitry 650 may be limited to performing only certain operations and/or a certain number of operations.

Enabling a local I/0 line and/or global I/O line can include enabling, e.g., turning on, activating, a transistor having a gate coupled to a decode signal, e.g., a column decode signal, and a source/drain coupled to the I/O line. However, embodiments are not limited to not enabling a local I/O line and/or global I/O line. For example, in a number of embodiments, the sensing circuitry 650 can be used to perform operations without enabling column decode lines of the array. However, the local I/O line(s) and/or global I/O line(s) may be enabled in order to transfer a result to a suitable location other than back to the memory array 630, e.g., to an external register.

The method may further include storing firmware instructions as instruction bits for performance of the operation, e.g., by the component, that are inaccessible to a read operation, write operation, and/or erase operation, among other data processing operations performed on the memory device 820. As such, the instructions for performance of operations important to functionality of the computing system may be protected from such data processing operations.

The method may further include performing the operation by the component on a chip on which the array section 425-0 and the adjacent array section 425-1 are positioned, as directed by an on-chip controller 840. As such, the operation may be performed without direction by an off-chip device, e.g., host 810.

While example embodiments including various combinations and configurations of sensing circuitry, sense amplifiers, compute components, microcode engines, e.g., including control logic, a sequencer, a timing component, etc., and/or controllers, etc., have been illustrated and described herein, embodiments of the present disclosure are not limited to those combinations explicitly recited herein. Other combinations and configurations of the sensing circuitry, sense amplifiers, compute components, microcode engines, e.g., including control logic, a sequencer, a timing component, and/or controllers, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A system, comprising:
a host coupled to an apparatus;
wherein the apparatus includes an array of memory cells and a controller coupled to the array of memory cells;
wherein the host is configured to send commands to the apparatus to direct movement of data within the array of memory cells;
wherein the controller is configured to execute the commands to:
direct movement of data from a first portion of memory cells in a row of a first subarray to a first portion of memory cells in a row of second subarray via a first sensing circuitry coupled to the first subarray and a third subarray and a second sensing circuitry coupled to the second subarray and the third subarray;

direct movement of the data from the second subarray to the third subarray via the second sensing circuitry; and direct movement of the data from a first portion of memory cells in a row of the third subarray to a second portion of memory cells in the row of the third subarray that are adjacent to the first portion of memory cells in the row of the third subarray, wherein:

the first portion of the memory cells in the row of the third subarray is coupled to the second sensing circuitry and second portion of the memory cells in the row of the third subarray is coupled to a third sensing circuitry that is different from the second sensing circuitry; and opening the row of the third subarray will cause the data to be stored in the first portion of memory cells in the row of the third subarray and then moved to the second portion of the memory cells in the row of the third subarray.

2. The system of claim 1, wherein movement of the data from the first row in the first subarray places the data on a number of first nodes of the first sensing circuitry coupled to the first row of memory cells.

3. The system of claim 1, wherein movement of the data from the first row of memory cells in the first subarray places a complement of the data on a number of second nodes of the first sensing circuitry coupled to the second subarray.

4. The system of claim 3, wherein movement of the complement of the data places the complement of the data on a number of second nodes of the second sensing circuitry.

5. The system of claim 3, wherein movement of the complement of the data places the data on a number of first nodes of the second sensing circuitry.

6. The system of claim 1, wherein the controller is further configured to:

direct movement of the data from the second sensing circuitry to a particular row of memory cells in the second subarray, wherein each memory cell of the particular row of memory cells is coupled to an adjacent memory cell of the particular row of memory cells.

7. The system of claim 6, wherein the controller is further configured to:

direct movement of the data from memory cells in the particular row of memory cells in the second subarray to adjacent memory cells in the particular row of memory cells in the second subarray.

8. An apparatus, comprising:

an array of memory cells; and a controller coupled to the array of memory cells and configured to:

direct movement of data from a first portion of memory cells in a row of a first subarray to a first sensing circuitry;

direct movement of the data and a complement of the data from the first sensing circuitry to a second sensing circuitry;

direct movement of the data from the second sensing circuitry to a row of a third subarray; and direct movement of the data from a first portion of memory cells in a row of the third subarray to a second portion of memory cells in the row of the third subarray that are adjacent to the first portion of memory cells in the row of the third subarray wherein:

the first portion of the memory cells in the row of the third subarray is coupled to the second sensing circuitry and the second portion of the memory cells in the row of the third subarray is coupled to a third sensing circuitry that is different from the second sensing circuitry; and opening the row of the third subarray will cause the data to be stored in the first portion of memory cells in the row of the third subarray and then moved to the second portion of the memory cells in the row of the third subarray.

9. The apparatus of claim 8, wherein movement of the data from the first portion of memory cells includes storing the data on a first number of nodes of the first sensing circuitry and storing the complement of the data on a second number of nodes of the first sensing circuitry.

10. The apparatus of claim 8, wherein the second number of nodes of the first sensing circuitry are coupled to a first number of nodes of the second sensing circuitry.

11. The apparatus of claim 8, wherein the first sensing circuitry is coupled to the first subarray and the third subarray.

12. The apparatus of claim 8, wherein the second sensing circuitry is coupled to the second subarray and the third subarray.

13. A method for operating a memory device, comprising:

sensing data stored in a first portion of memory cells on a row in a first subarray;

moving the data to a first sensing circuitry stripe coupled to the first portion of memory cells;

moving a complement of the data from the first sensing circuitry stripe to a first portion of memory cells on a row in the second subarray;

moving the data from the first sensing circuitry stripe to a second portion of memory cells on the row in the second subarray;

moving the data and the complement of the data to a second sensing circuitry stripe coupled to second portion of memory cells on the row in the second subarray;

moving the data from the second sensing circuitry stripe to a first portion of memory cells on a row in a third subarray; and moving the data from the first portion of memory cells in the row of the third subarray to a second portion of memory cells in the row of the third subarray that are adjacent to the first portion of memory cells in the row of the third subarray, wherein:

the first portion of the memory cells in the row of the third subarray are coupled to the second sensing circuitry stripe and second portion of the memory cells in the row of the third subarray is coupled to a third sensing circuitry stripe that is different from the second sensing circuitry stripe; and opening the row of the third subarray will cause the data to be stored in the first portion of memory cells in the row of the third subarray and then moved to the second portion of the memory cells in the row of the third subarray.

14. The method of claim 13, further including moving the data from the second portion of memory cells on the row in the third subarray to the second portion of memory cells on another row in the third subarray.

15. The method of claim 13, further including shifting the complement of the data from the first portion of memory cells on the row in the second subarray to a second portion of memory cells on the row in the second subarray.

16. The method of claim 13, wherein moving the data to the first sensing circuitry stripe including moving the data to nodes of the first sensing circuitry stripe coupled to the first subarray.

17. The method of claim 13, wherein moving the data to the first sensing circuitry stripe including moving the complement of the data to nodes of the first sensing circuitry stripe coupled to the second subarray.

* * * * *